United States Patent [19]
Seliskar et al.

[11] Patent Number: 5,858,828
[45] Date of Patent: Jan. 12, 1999

[54] USE OF MEV IMPLANTATION TO FORM VERTICALLY MODULATED N+ BURIED LAYER IN AN NPN BIPOLAR TRANSISTOR

[75] Inventors: John J. Seliskar, Colorado Springs; David W. Daniel, Divide; Todd A. Randazzo, Colorado Springs, all of Colo.

[73] Assignee: Symbios, Inc., Fort Collins, Colo.

[21] Appl. No.: 801,668

[22] Filed: Feb. 18, 1997

[51] Int. Cl.$^6$ ............... H01L 21/74; H01L 21/22; H01L 21/8222; H01L 21/265
[52] U.S. Cl. ............ 438/234; 438/370; 438/526; 438/509; 438/950; 257/565
[58] Field of Search ................. 438/228, 526, 438/154, 234, 339, 420, 370, 377, 197, 336, 350, 369, 376; 257/372, 370, 553, 378, 550, 552, 526, 539, 558

[56] References Cited

U.S. PATENT DOCUMENTS

| | | | |
|---|---|---|---|
| 4,710,477 | 12/1987 | Chen | 438/420 |
| 4,711,017 | 12/1987 | Lammert | 438/359 |
| 4,729,964 | 3/1988 | Natsuaki | 438/420 |
| 4,732,869 | 3/1988 | Van Attekum et al. | 438/514 |
| 5,121,185 | 6/1992 | Tamba et al. | 257/553 |
| 5,160,996 | 11/1992 | Odanaka | 257/375 |
| 5,436,176 | 7/1995 | Shimizu et al. | 438/370 |
| 5,501,993 | 3/1996 | Borland | 438/228 |

FOREIGN PATENT DOCUMENTS

| | | | |
|---|---|---|---|
| 0731387 | 9/1996 | European Pat. Off. | G03F 7/00 |
| 3026218 | 2/1982 | Germany | H01L 29/72 |
| 19611692 | 3/1996 | Germany | H01L 29/73 |
| 06314663 A | 4/1993 | Japan | 438/154 |

OTHER PUBLICATIONS

Characteristics of Bipolar Transistors with Various Depths of n+ Buried Layers Formed by High–Energy Ion Implantation, Akihiro Tamba, Yutaka Kobayashi, Tadeshi Suzuki and Nobuyoshi Natsuaki, Japanese Journal of Applied Physics pp. 156–160, Dec. 1991.

Tamba A et al: Characteristics of Bipolar Transistors with Various Depth N+ Buried Layers Formed by High Energy Ion Implantation; Extended Abstracts of the International Conference on Solid State Devices and Materials; Tokyo, Aug. 24–26, 1988; No. Conf. 20, 24 Aug. 1988, Japan Society of Applied Physics; pp. 141–144; XP000042517.

*Primary Examiner*—Olik Chaudhuri
*Assistant Examiner*—William David Coleman
*Attorney, Agent, or Firm*—Duke W. Yee; Wayne P. Bailey

[57] ABSTRACT

High energy implantation through varying vertical thicknesses of one or more films is used to form a vertically modulated sub-collector, which simultaneously reduces both the vertical and lateral components of parasitic collector resistance in a vertically integrated bipolar device. The need for a sinker implant or other additional steps to reduce collector resistance is avoided. The necessary processing modifications may be readily integrated into conventional bipolar or BiCMOS process flows.

17 Claims, 43 Drawing Sheets

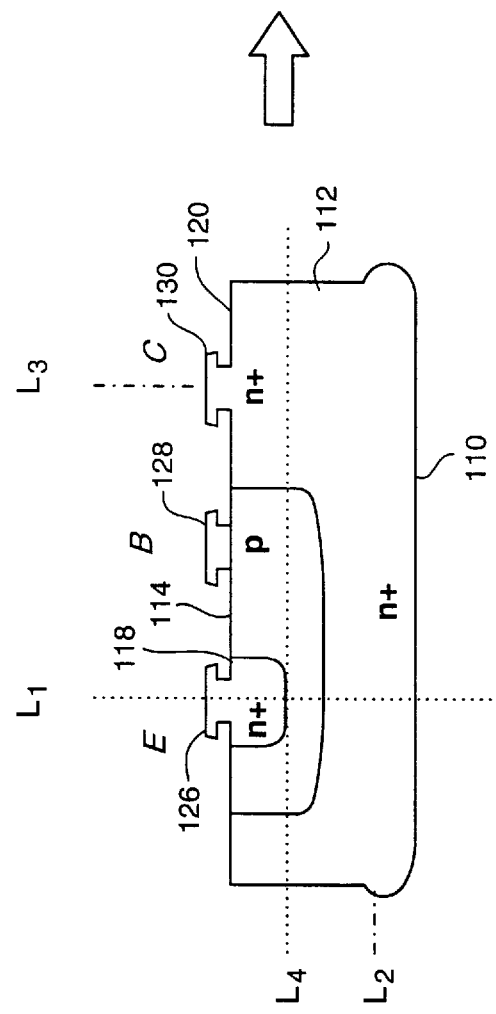
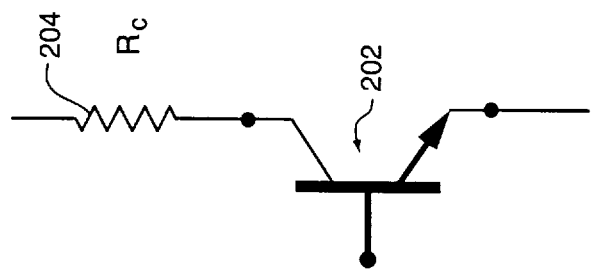
FIG. 2A
*PRIOR ART*
FIG. 2B
*PRIOR ART*

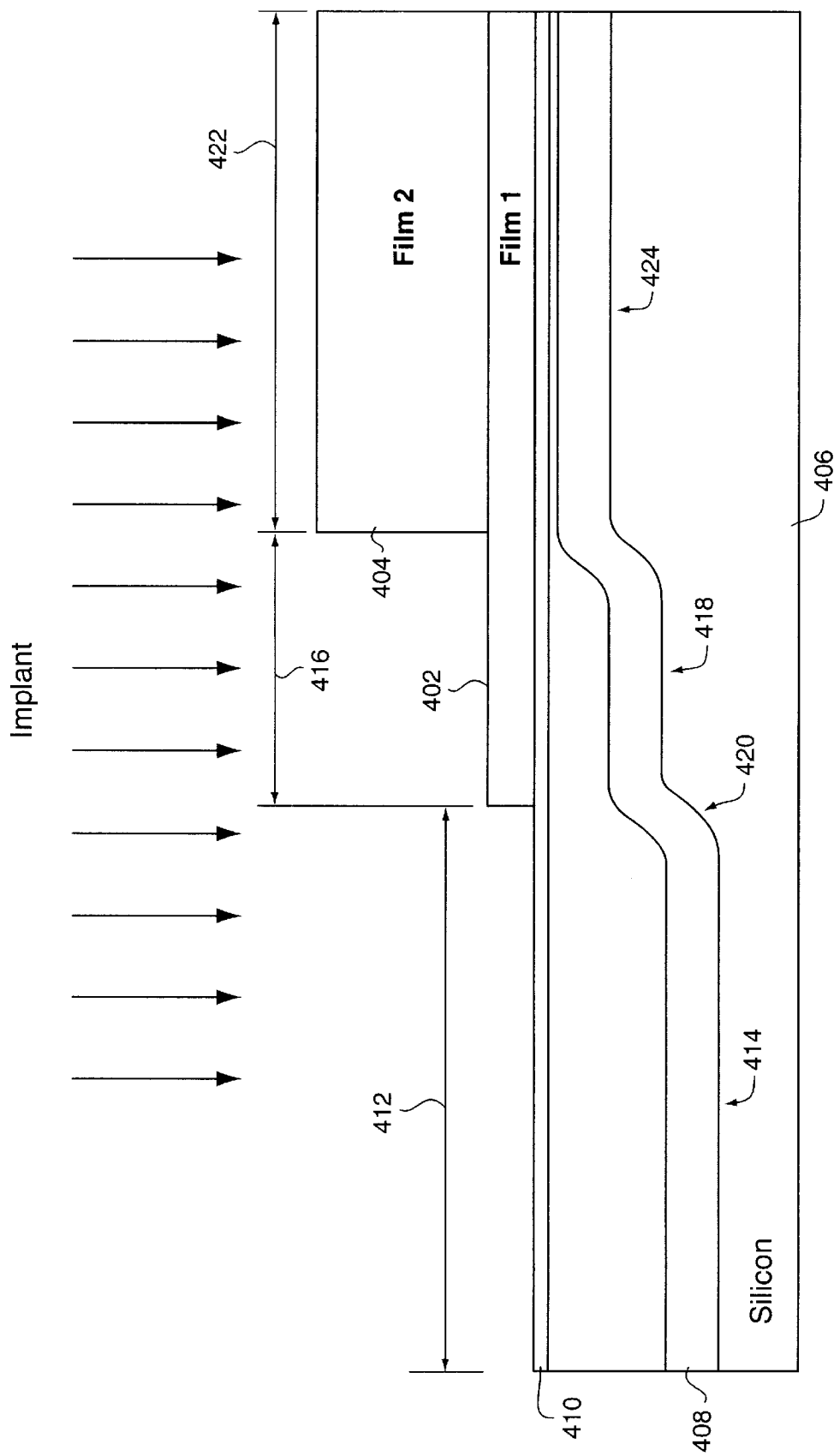

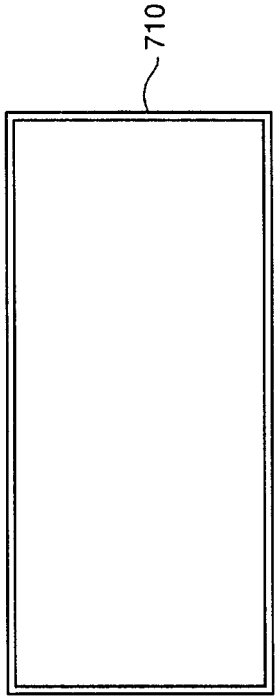
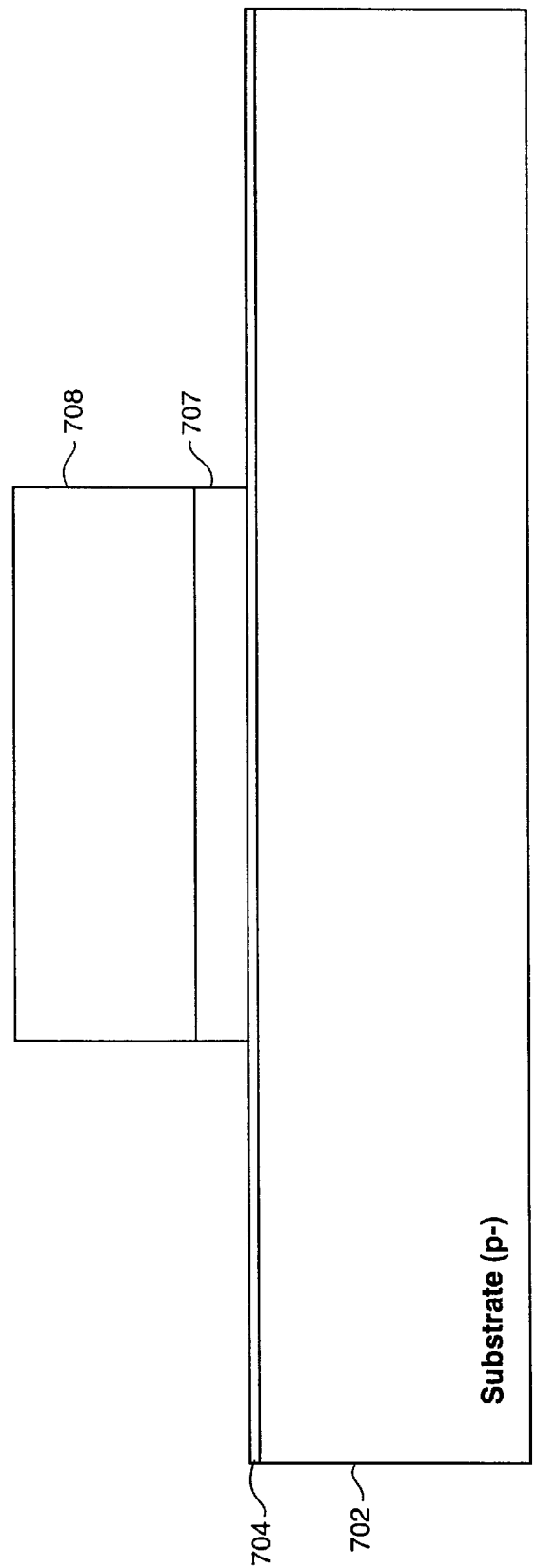
FIG. 14A
FIG. 14B

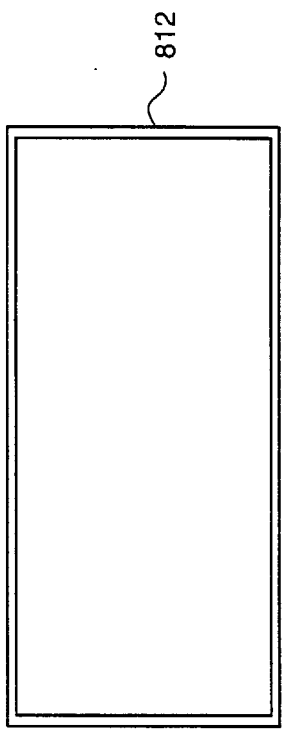
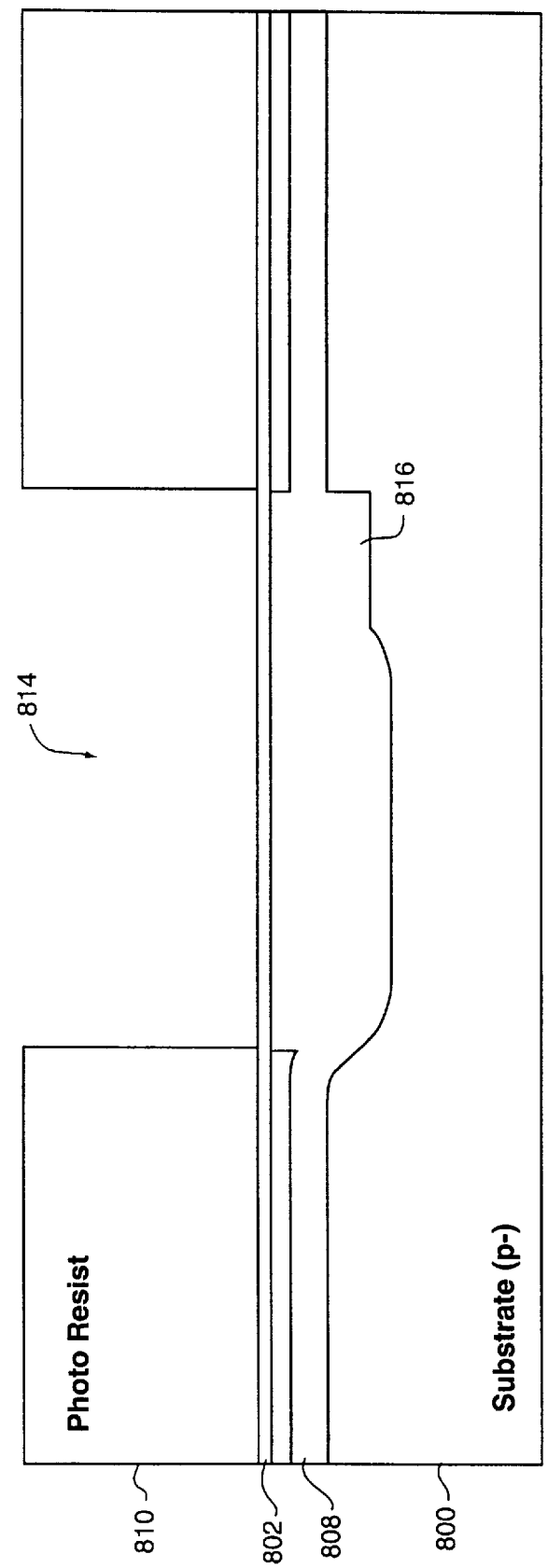
FIG. 22A
FIG. 22B

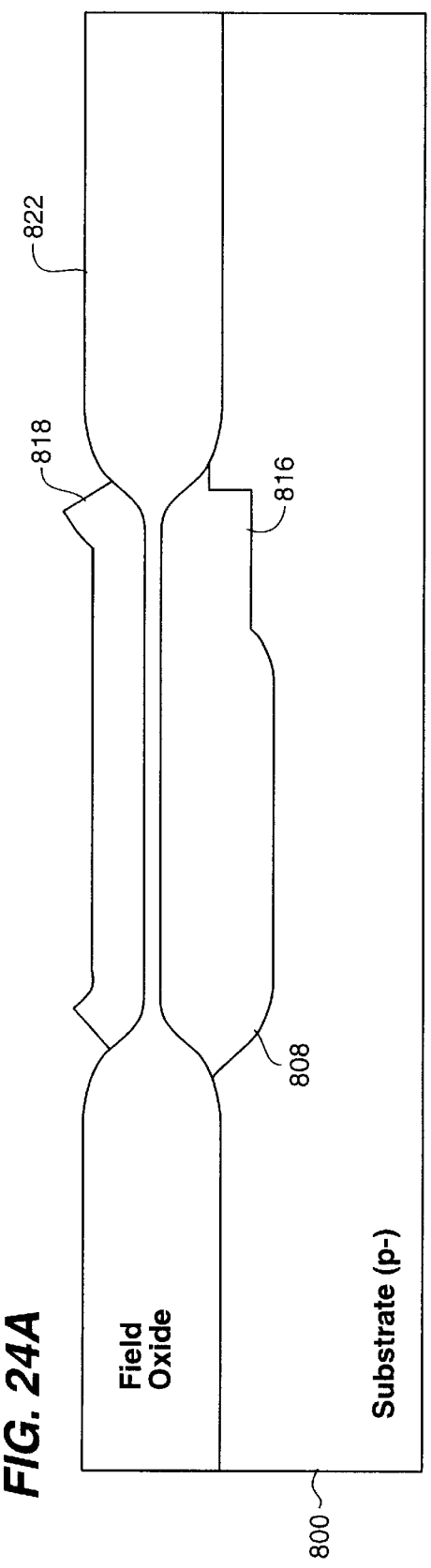
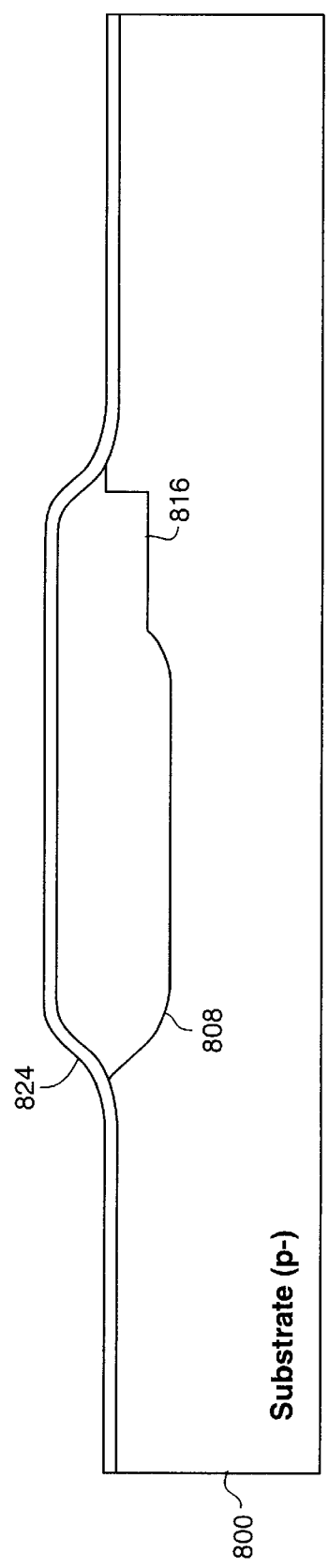
FIG. 24A
FIG. 24B

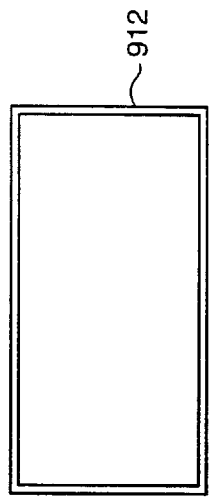
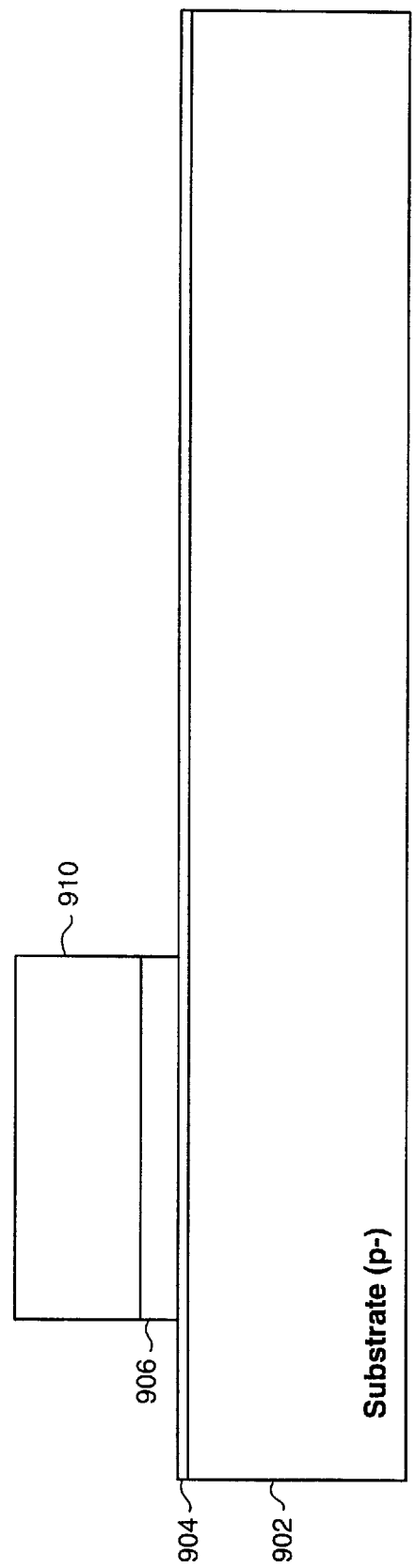
FIG. 30A
FIG. 30B

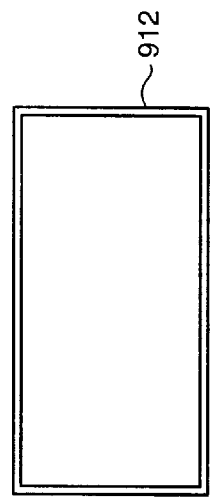
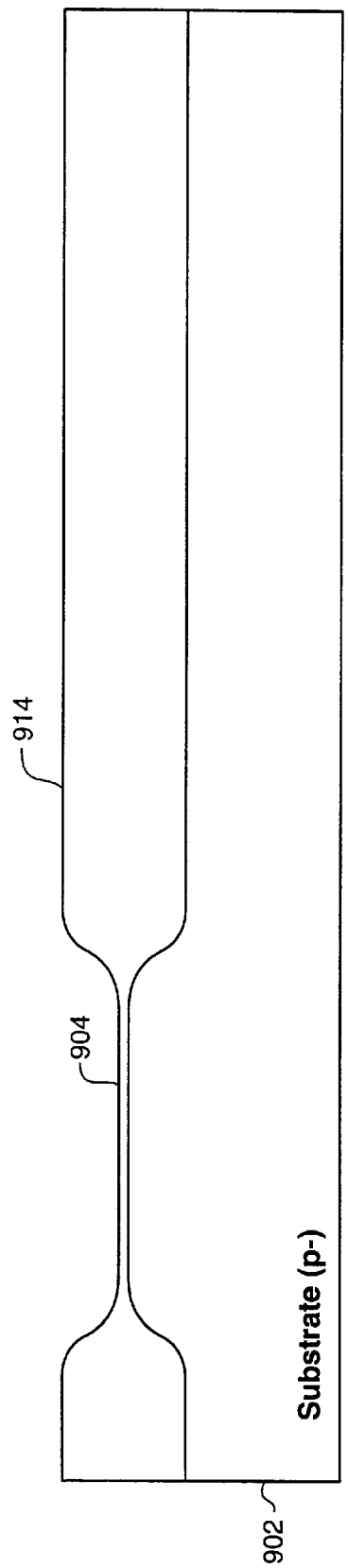
FIG. 31A
FIG. 31B

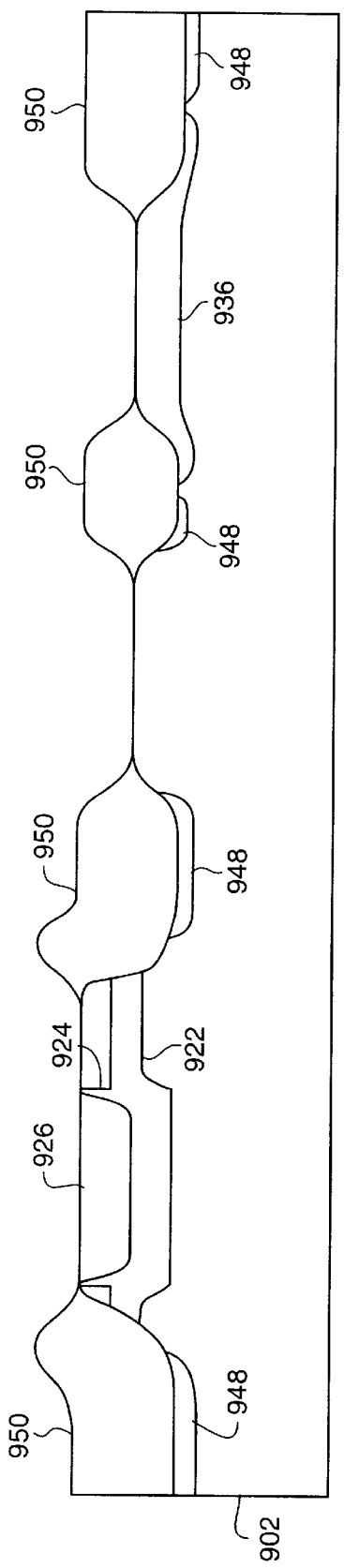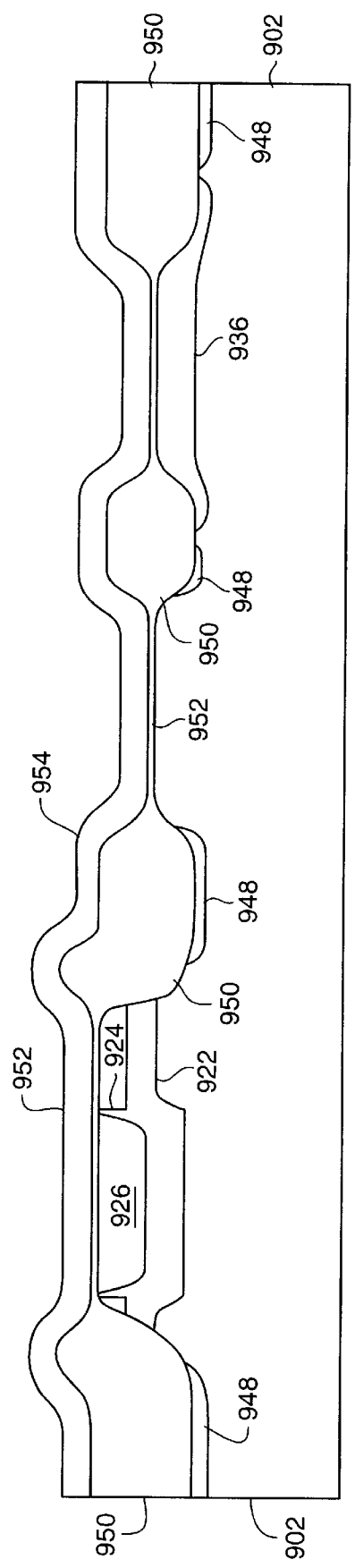

USE OF MEV IMPLANTATION TO FORM VERTICALLY MODULATED N+ BURIED LAYER IN AN NPN BIPOLAR TRANSISTOR

BACKGROUND OF THE INVENTION

1. Technical Field

The present invention relates generally to bipolar junction transistors and in particular to bipolar junction transistors formed in the same integrated circuit with complimentary metal-oxide-semiconductor transistors (BiCMOS). Still more particularly, the present invention relates to formation of bipolar transistors with reduced vertical collector resistance.

2. Description of the Related Art

Silicon technologies that employ both complimentary metal-oxide-semiconductor (CMOS) and bipolar devices on the same silicon substrate (BiCMOS) provide an excellent solution to many types of mixed-signal chip designs.

FIG. 1 depicts a known simple, low cost NPN bipolar device commonly employed in BiCMOS designs along with the mask levels used to form this device. The bipolar device 100 is formed in a heavily-doped substrate 102, on which a lightly doped epitaxial layer 104 has been deposited. A field oxide 106 is grown for device isolation. A silicon nitride layer (not shown) prevents growth of the field oxide 106 in the region of the device window 108.

Buried collector 110 is typically implanted, followed by formation of the collector region 112. A masking layer (not shown) is provided to allow base region 114 to be formed through a base region window 116 in the masking layer. Emitter region 118 and collector contact region 120 are similarly formed by windows 122, 124 through a masking layer (not shown). Emitter (E), base (B), and collector (C) contacts 126, 128 and 130, respectively, are formed through contact openings 132. The process results in vertically integrated NPN bipolar device 100.

Critical to the slew-rate performance of vertically integrated bipolar junction transistors is the collector resistance. FIG. 2 illustrates the collector resistance of vertically integrated bipolar junction transistors through the bipolar device of FIG. 1 and its equivalent circuit diagram. As shown in FIG. 2, the bipolar device of FIG. 1 may be represented as a bipolar transistor 202 with a resistor 204 at the collector having a resistance of $R_c$. Collector resistance $R_c$ has both a vertical component, arising from the vertical distance $(L_4-L_2)$ between collector contact 130 and the body of the collector, and a lateral component, arising from the horizontal distance $(L_3-L_1)$ between the emitter and collector contacts 126 and 130. Both components are significant to bipolar device performance.

FIG. 3A depicts the prior art method of minimizing collector resistance to optimize device performance. Buried layer formation, producing a heavily doped layer (buried collector or subcollector 110) deep within the collector, reduces the lateral component of collector resistance $R_c$. A "sinker" formation 302 in the collector contact region is typically used to minimize the vertical component of collector resistance $R_c$. However formation of sinker 302 typically requires additional process steps.

It would be advantageous to be able to reduce both the vertical and lateral components of the collector resistance in a device without adding significantly to the process steps required to form a vertically integrated bipolar device. It would be desirable to be able to reduce both the vertical and lateral components of the collector resistance simultaneously.

SUMMARY OF THE INVENTION

High energy implantation through varying vertical thicknesses of one or more films is used to form a vertically modulated sub-collector, which simultaneously reduces both the vertical and lateral components of parasitic collector resistance in a vertically integrated bipolar device. The need for a sinker implant or other additional steps to reduce collector resistance is avoided. The necessary processing modifications may be readily integrated into conventional bipolar or BiCMOS process flows.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 2 is the vertically integrated bipolar device of FIG. 1 and its equivalent circuit diagram;

FIG. 4 is an illustration of a generic vertically modulated implant layer realized by implanting through two films;

FIGS. 13–19 depict an alternative process flow for forming a vertically modulated subcollector for a bipolar device in accordance with a preferred embodiment of the present invention;

FIGS. 20–27 illustrate a third process flow for forming a vertically modulated subcollector for a bipolar device in accordance with a preferred embodiment of the present invention; and FIGS. 28–43 depict a fully integrated BiCMOS flow incorporating a vertically modulated subcollector for the bipolar device in accordance with a preferred embodiment of the present invention.

DETAILED DESCRIPTION

Figure 1A:
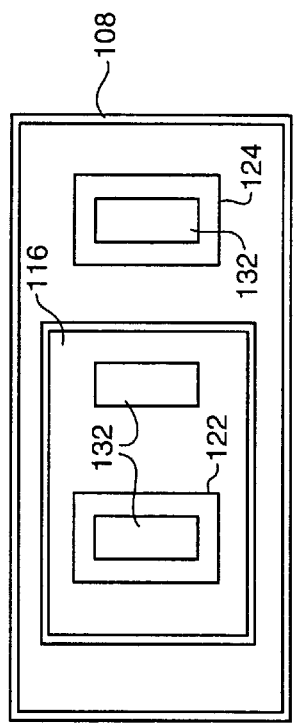
FIG. 1 depicts a vertically integrated bipolar device design commonly employed in the prior art, along with the mask levels utilized to form this device.
Figure 1B:
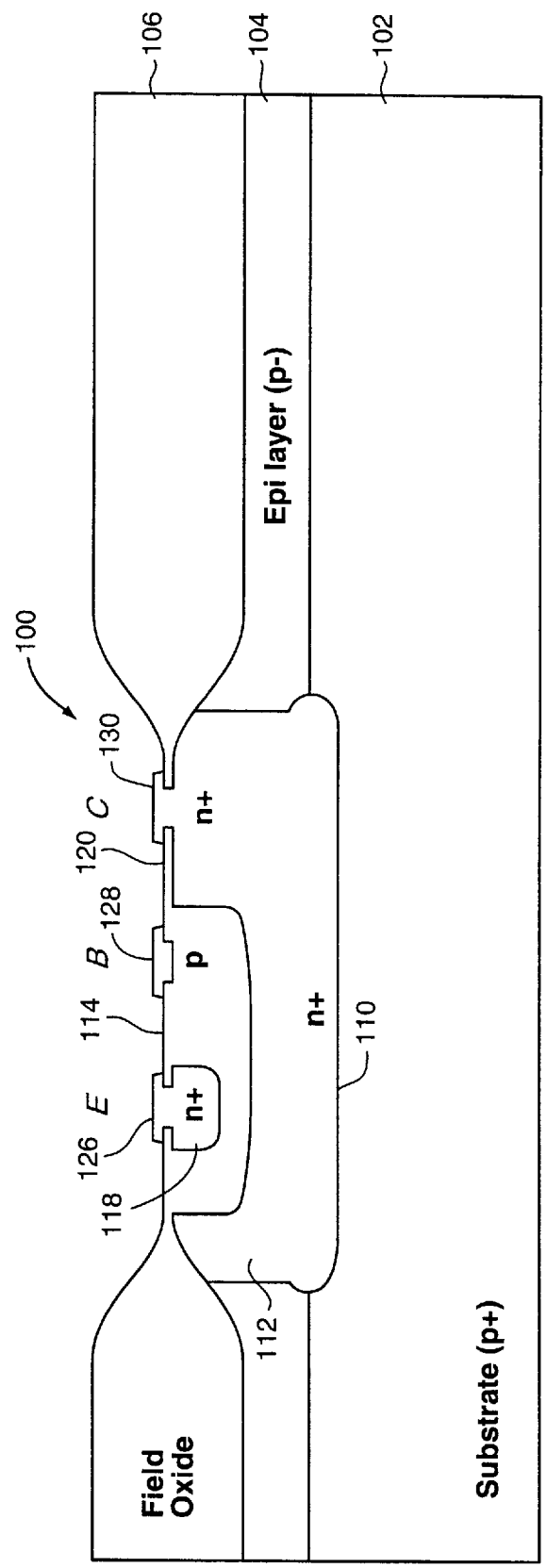
Figure 3A:
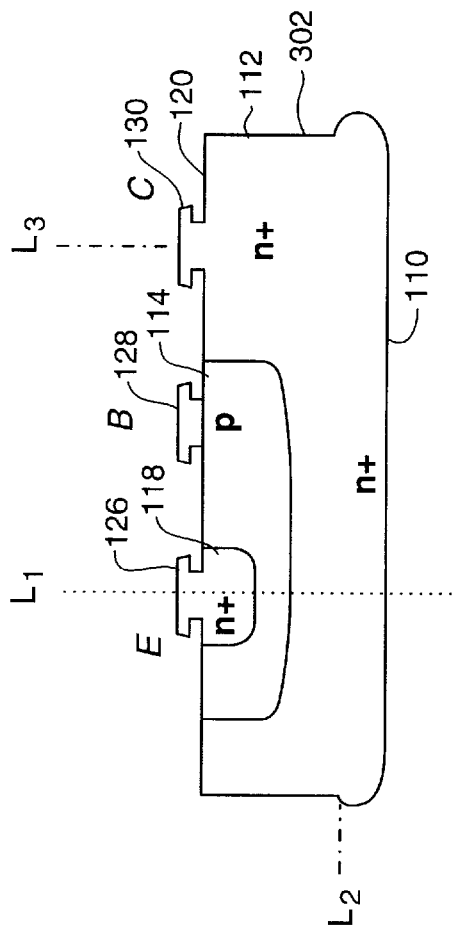
FIGS. 3A and 3B depict, for comparison purposes, a prior art bipolar device employing a prior art approach to reducing collector resistance and an exemplary embodiment of the present invention.
Figure 3B:
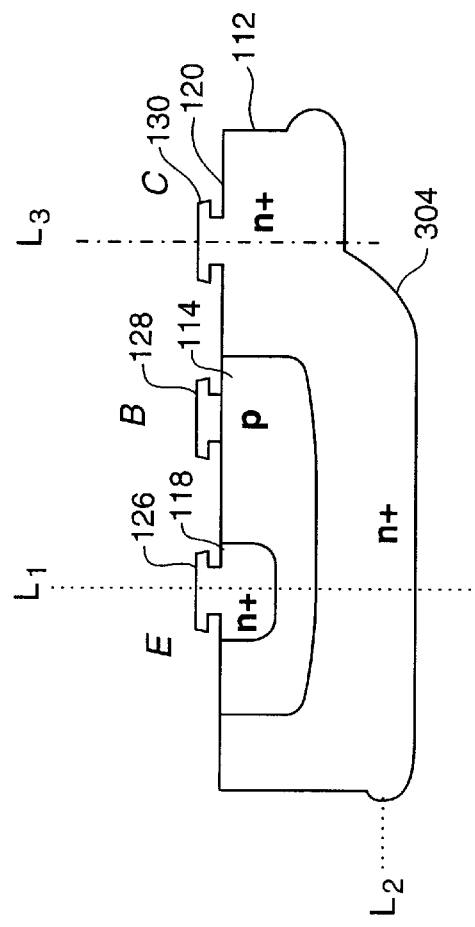

With reference now to the figures, and in particular with reference to FIG. 3B, a bipolar device in accordance with the preferred embodiment of the present invention is depicted. The figures representing device profiles or cross-sections of portions of an integrated circuit during fabrication are not drawn to scale, but instead are drawn so as to illustrate the important features of the invention. The process steps and structures described below do not form a complete process flow for manufacturing integrated circuits. The present invention may be practiced in conjunction with integrated circuit fabrication techniques currently used in the art, and only so much of the commonly practiced process steps are included as are necessary for an understanding of the present invention.

In lieu of both a buried subcollector and sinker, a vertically modulated subcollector 304 is employed in FIG. 3B to reduce both the vertical and lateral components of the collector resistance. The differential penetration of a high-energy implant creates both a buried layer and its connection to the collector, simultaneously. Collector resistance is significantly reduced without the need for separate process steps forming buried collector and sinker structures. The resulting technology has a higher performance-to-price ratio.

Subcollector 304 in FIG. 3B is a vertically modulated buried layer formed by the high energy implant. Subcollector 304 includes a portion beneath the base region 114 which is vertically displaced from the portion of subcollector 304 beneath collector contact region 120. At least the portion of subcollector 304 beneath the base region 114 overlaps or intersects the well forming collector region 112. Subcollector 304 is an integral, heavily doped region formed by a single implant. Subcollector 110 and sinker 302 in FIG. 3A, remain distinct despite overlapping or contacting, and are formed by separate implants. Thus, a danger exists that sinker 302, if not properly implanted, will not contact or overlap subcollector 110. In that event, reduction of collector resistance by sinker 302 is less effective. Use of vertically modulated subcollector 304 as shown in FIG. 3B avoids this potential problem.

Referring to FIG. 4, the process for forming a generic vertically modulated implant is illustrated. The technique employed is similar to that described in U.S. Pat. No. 5,501,993 to J. Borland entitled *Method of Constructing CMOS Vertically Modulated Wells (VMW) by Clustered MeV BILLI (Buried Implanted Layer for Lateral Isolation) Implantation*. Differential film heights are utilized to modulate the vertical doping profile in a substrate resulting from a single implant. A first film 402 and a second film 404, which is not coextensive with first film 402 mask an implant into substrate 406. Films 402 and 404 may be photoresist, grown or deposited oxides, nitride, polysilicon, or other suitable implant masking films. A single film having a vertical profile modified by photolithography, etch, or other means may also be used.

In the depicted example, the combination of films modulates implant(s) into substrate 406, resulting in a vertically-modulated implant layer 408. Impurities of different conductivity types may be implanted. Donor (n-type) impurities such as phosphorous or arsenic and acceptor (p-type) impurities such as boron may be implanted through the films, as well as neutral impurities such as silicon or germanium. Substrate 406 may be any type of suitable substrate such as a semiconductor crystal (monocrystalline substrate), a substrate with epitaxial layers or doped regions, or a semiconductor-on-insulator (SOI) substrate.

The dose or concentration and the implantation energy required to form buried layer 408 will depend on a variety of factors known to those skilled in the art, including the materials used for films 402 and 404, the thickness of films 402 and 404, and the impurity being implanted. By selecting the implant energy and the material, position, and thickness of films 402 and 404 appropriately, the doping profile of buried layer 408 may be tailored to device requirements. Implanted impurities passing through a region 412 in which substrate 406 is exposed (or covered only by a thin oxide 410) results in a portion 414 of buried layer 408 with the deepest implantation depth. In a region 416 where substrate 406 is covered by first film 402, impurities from the same implant form a portion 418 of buried layer 408 which is somewhat shallower. Both portions 414 and 418 of buried layer 408 are formed by a single implant, using a single dose and energy. A fringe effect of the implantation causes buried layer 408 to smoothly transition 420 between the deepest portion 414 and the shallower portion 418.

In another region 422, where substrate 406 is covered by film 402 and a second film 404, implanted impurities are implanted to the shallowest portion 424 of buried layer 408. Although depicted as buried in substrate 406, the material or thickness of film 404 may be selected so as to prevent impurities from reaching substrate 406, forming the shallowest portion 424 of buried layer 408 within film 402 or film 404. Films 402 and 404 may then be subsequently removed, and with them the shallowest portion 424 of implanted layer 408.

Films 402 and 404 may be different materials selected for different penetration rates by the implant species, or may simply be different layers of the same material. Although the depicted example employs two films for the implantation mask, a single film may be sufficient or three or more films may be used, depending on the implementation. For example, a bilevel implanted layer may be formed with an implantation mask of a single film, covering and exposing selected portions of the substrate. The edge of a film, or the transition between regions where the substrate is covered and exposed, may be a single step, multiple steps, a taper, or any other suitable geometry. Variations in film materials and profiles are limited only by processing constraints.

Figure 5A:
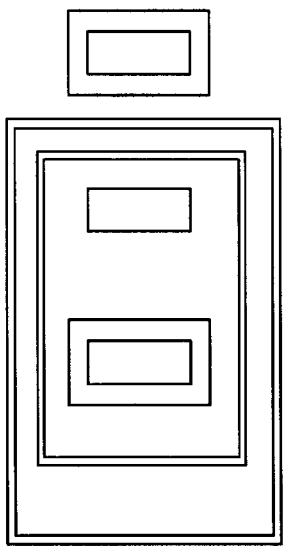
FIG. 5 depicts the final structure of an NPN bipolar device with a vertically modulated subcollector in accordance with a preferred embodiment of the present invention, along with two possible masking layouts for forming the vertically modulated subcollector.
Figure 5B:
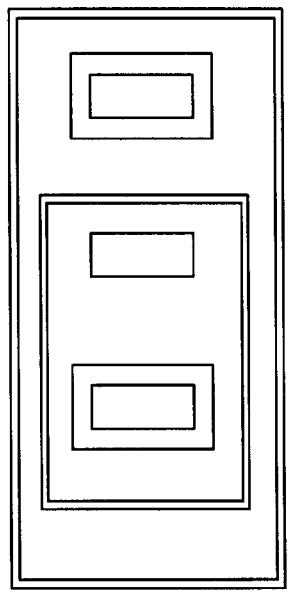
Figure 5C:
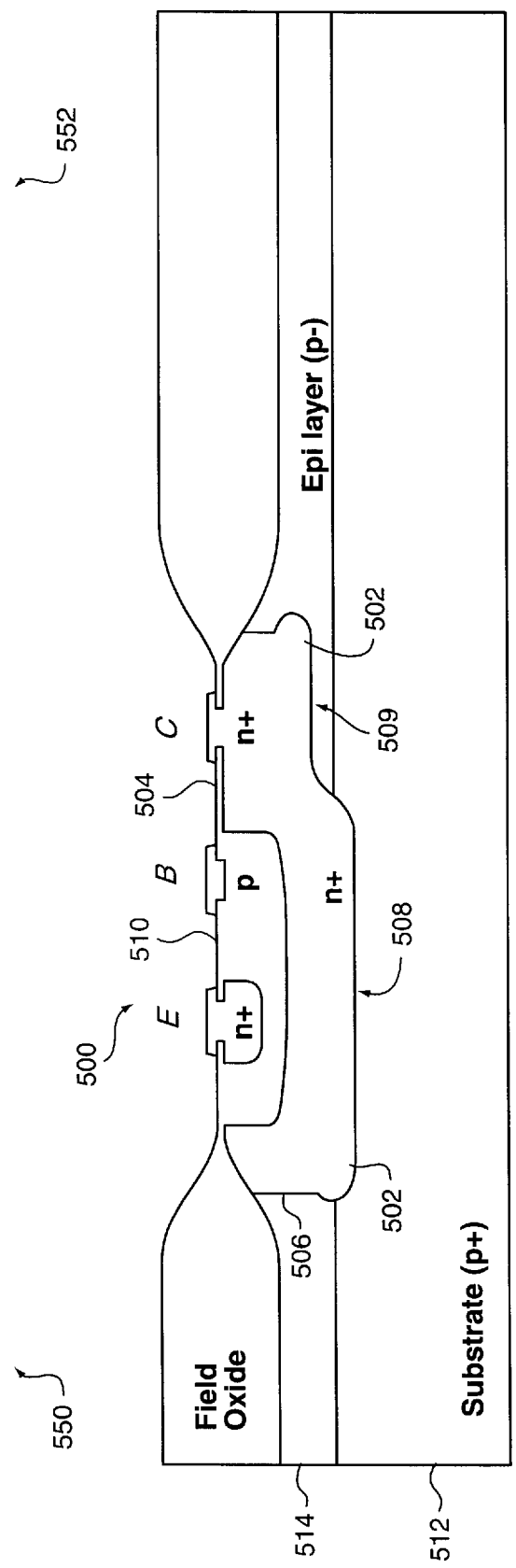

With reference now to FIG. 5, the final structure of an NPN bipolar device with a vertically modulated subcollector in accordance with a preferred embodiment of the present invention is depicted, along with two possible masking layouts. Vertically modulated subcollector 502, an integral, heavily doped buried layer, contacts or overlaps the collector contact region 504, reducing collector resistance in the vertically integrated NPN device 500. Subcollector 502 overlaps collector 506 at least in a portion 508 of subcollector 502 underlying base 510. Another portion 509 of subcollector 502 is vertically displaced from the portion 508 underlying base 510.

In the depicted example, the semiconductor body in which bipolar device 500 is formed comprises a monocrystalline, heavily doped substrate 512 on which a lightly doped epitaxial layer 514 was grown or deposited.

Generally, a variety of process integration solutions exist for bipolar devices, depending on the device structure. CMOS devices, by comparison, tolerate a fairly limited number of process variations. An illustrative sample of the process flows capable of forming the NPN bipolar device of FIG. 5 are described below, although it will be understood that others are possible. All flows described are illustrated as being formed on bulk silicon wafers. However, the same flows will work on other substrates as well, such as bulk substrates with a deposited layer of high resistivity epitaxial silicon.

Each process flow described is compatible with conventional BiCMOS processes. In all flows illustrated, for example, the effect of the buried n+ layer is tailored or modified so as to not interfere with a required field implant found in most CMOS, bipolar, and BiCMOS process integrations. Those skilled in the art will recognize that other methods of avoiding conflict exist.

Either mask sequence 550 or 552 depicted in FIG. 5 may be used, depending on the process flow employed. The process flows described in conjunction with FIGS. 6–12 and FIGS. 13–19 utilizes mask sequence 550, while the process flow described in conjunction with FIGS. 20–27 utilize mask sequence 552.

Referring to FIGS. 6–12, a process flow for forming a vertically modulated subcollector in accordance with a preferred embodiment of the present invention is illustrated, along with the mask levels used in the process. In the process depicted, mask sequence 550 from FIG. 5 is used with the collector mask initially used in a dark field mode. If positive resist is being used, in a clear field mode, islands of photoresist remain only where the mask is opaque. In dark field mode, openings in photoresist are formed in regions where the mask is NOT opaque. Clear field shapes leave islands of resist, whereas Dark field shapes leave holes in resist.

Figure 6:
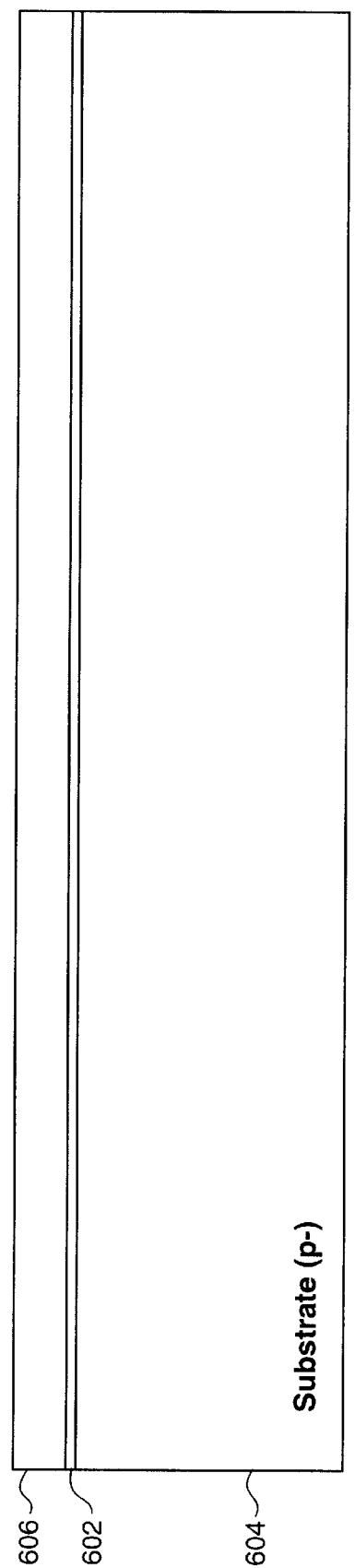
FIGS. 6–12 illustrate a process flow for forming a vertically modulated subcollector for a bipolar device in accordance with a preferred embodiment of the present invention.
Figure 7A:
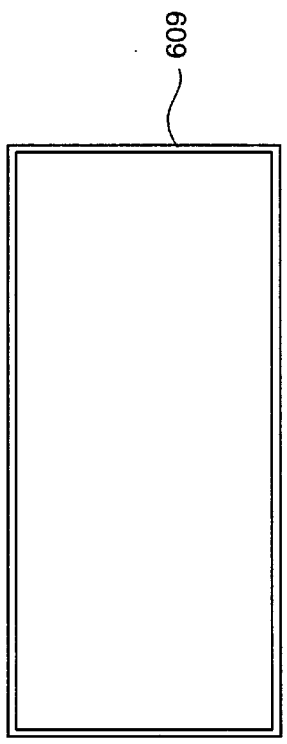
Figure 7B:
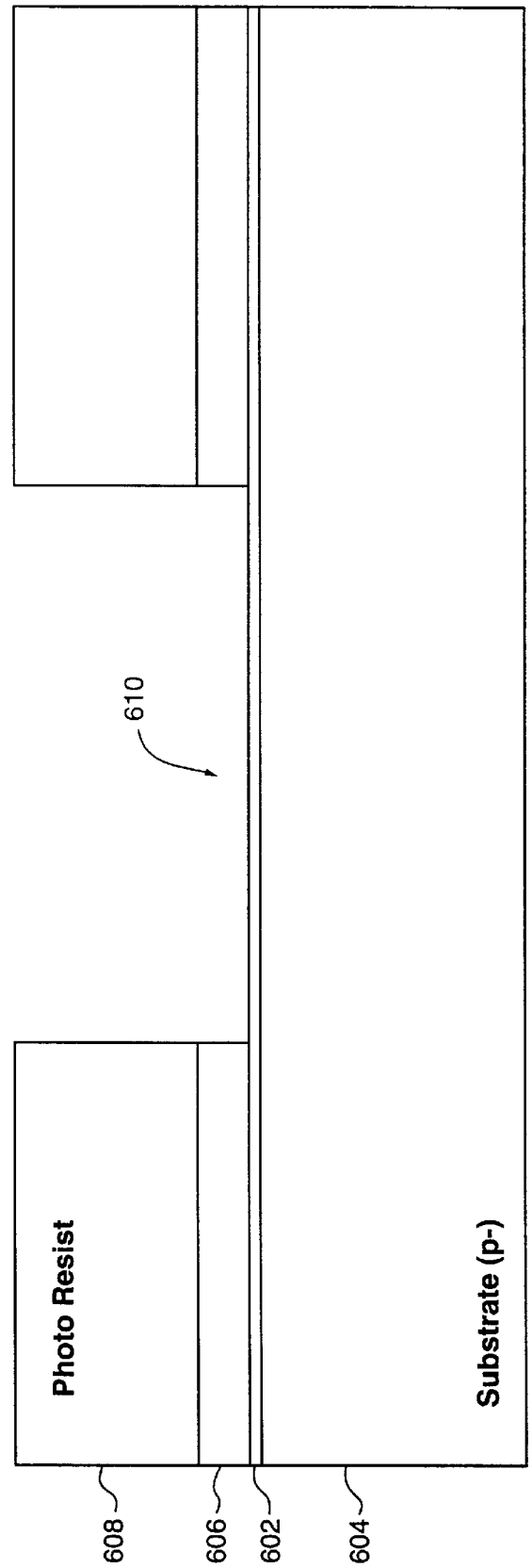

As depicted in FIG. 6, a support/screen oxide 602 is first grown on substrate 604, followed by deposition of silicon nitride layer 606, preferably by a furnace LPCVD. Substrate 604 is a lightly doped p-substrate in the depicted example. Next, as illustrated in FIG. 7, a layer of photoresist 608 is deposited and patterned with the collector mask 609 to etch a window 610 in silicon nitride 606.

Figure 8A:
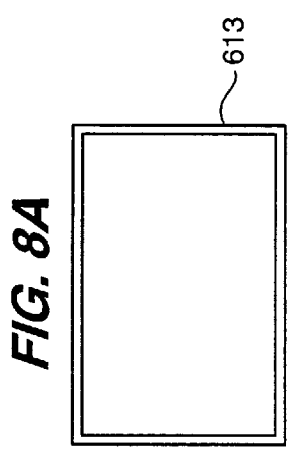
Figure 8B:
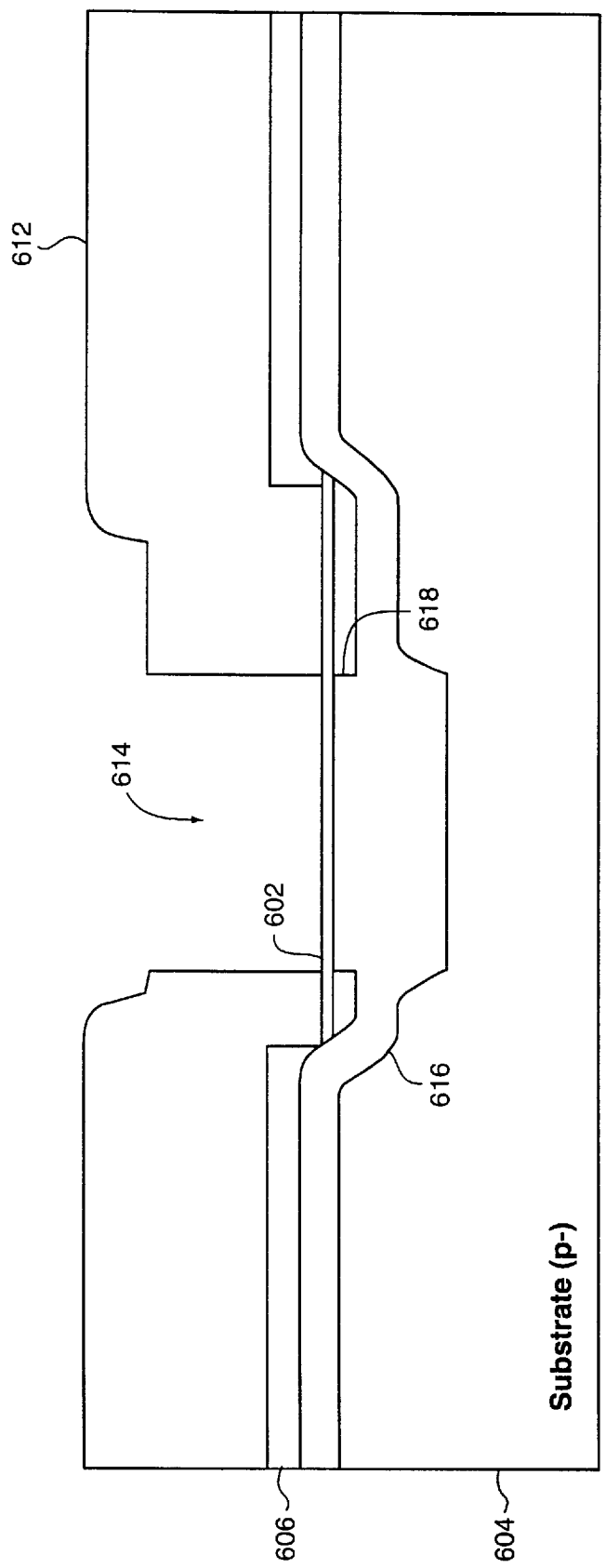

Following the silicon nitride etch, photoresist layer 608 is removed. As depicted in FIG. 8, a new photoresist layer 612 is deposited and patterned using base mask 613 to form a window 614 defining the base region. Opening 614 in photoresist layer 612 is smaller than opening 610 in silicon nitride 606. A high energy implant using a suitable donor species (arsenic, phosphorous, antimony, etc.) is then performed to form vertically modulated buried n+ region 616 for the subcollector. Photoresist layer 612 and silicon nitride layer 606 modulate the vertical doping profile resulting from the implant. Thus, photoresist layer 612 thickness, silicon nitride layer 606 thickness, and implant conditions (dose, energy) may be modified to control the buried n+ layer doping profile. It may be preferable to adjust these variables so that, outside the region defined by the collector mask, the doping profile of the n+ region lies within the silicon nitride layer 606 and may be subsequently removed.

Figure 9A:
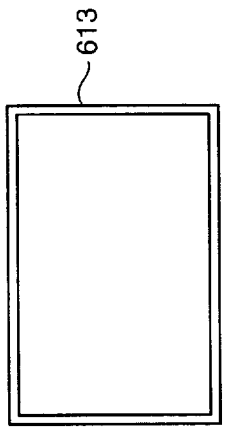
Figure 9B:
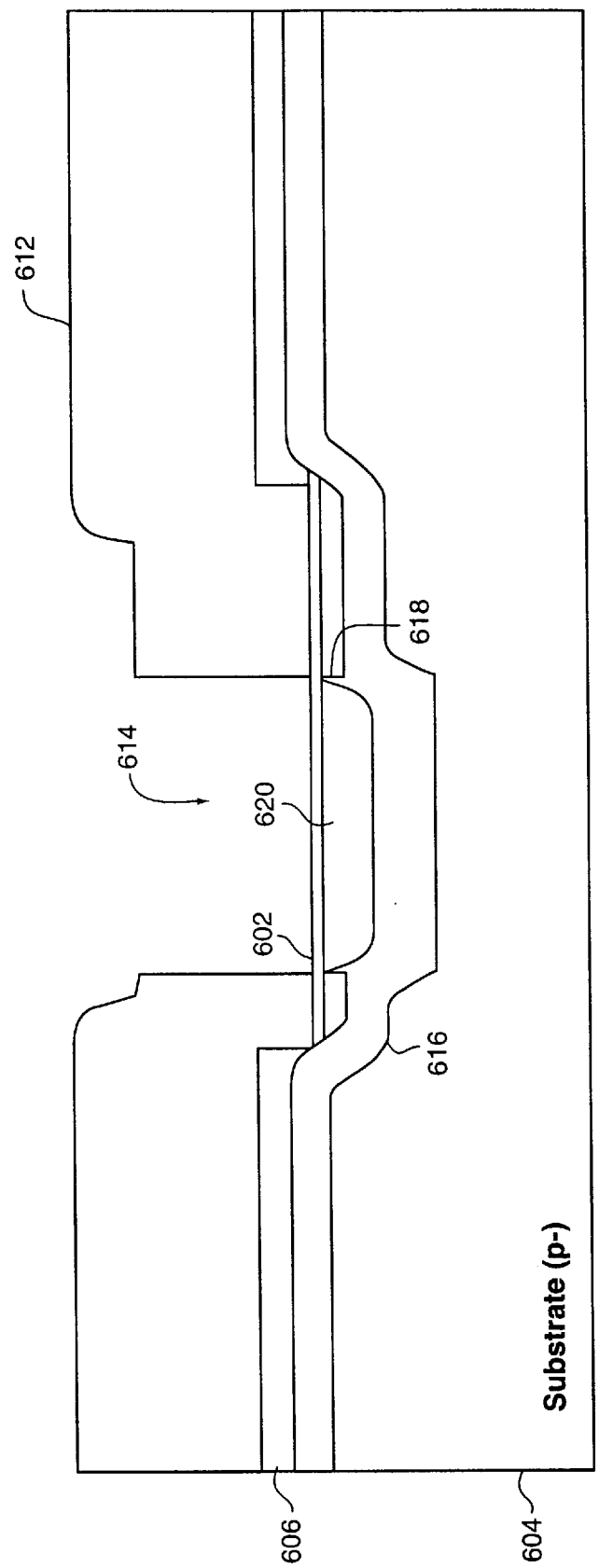

An additional implant through window 614 in photoresist 612 forms n-well 618 for the collector. In this embodiment, n-well 618, which forms the collector, overlaps or intersects only part of that portion of buried n+ layer 616 which will form the subcollector. As illustrated in FIG. 9, the same photoresist layer 612 with the patterned window 614 may be used to implant p-region 620 for the base. Depending on the desired final device characteristics, it may be desirable to implant the base region at a later point in the process by repeating the photo masking operations used in FIG. 8.

Figure 10A:
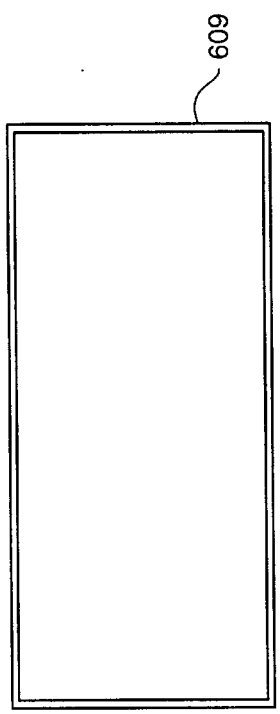
Figure 10B:
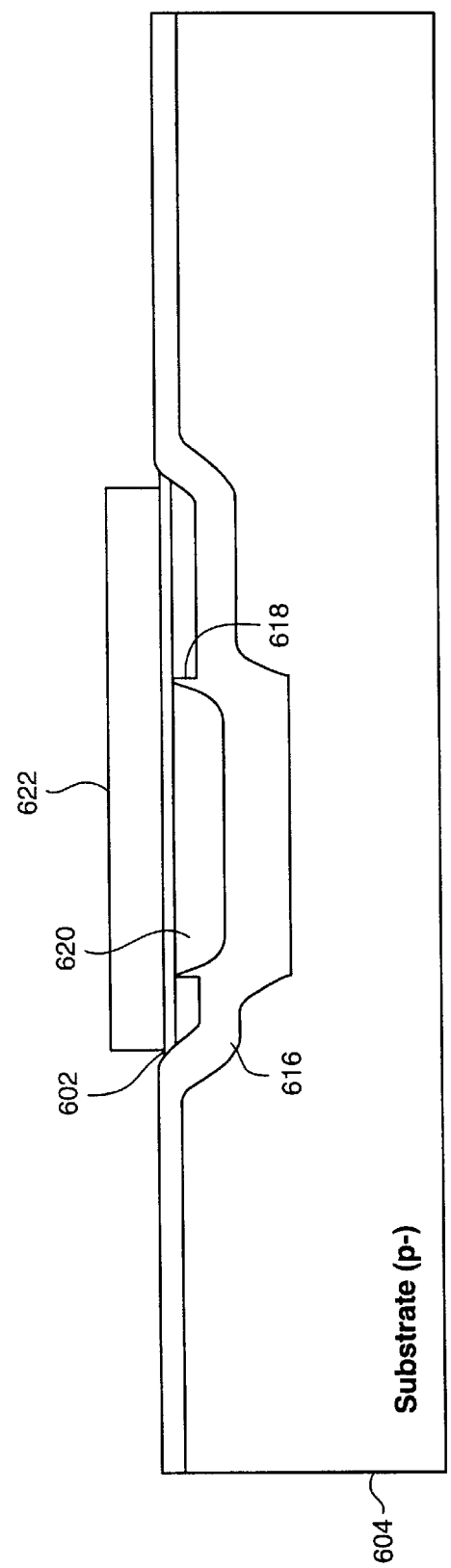
Figure 11A:
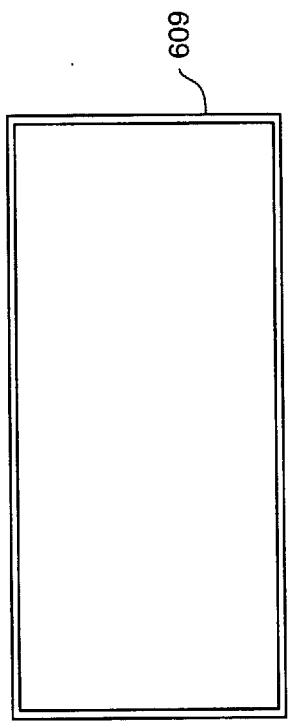
Figure 11B:
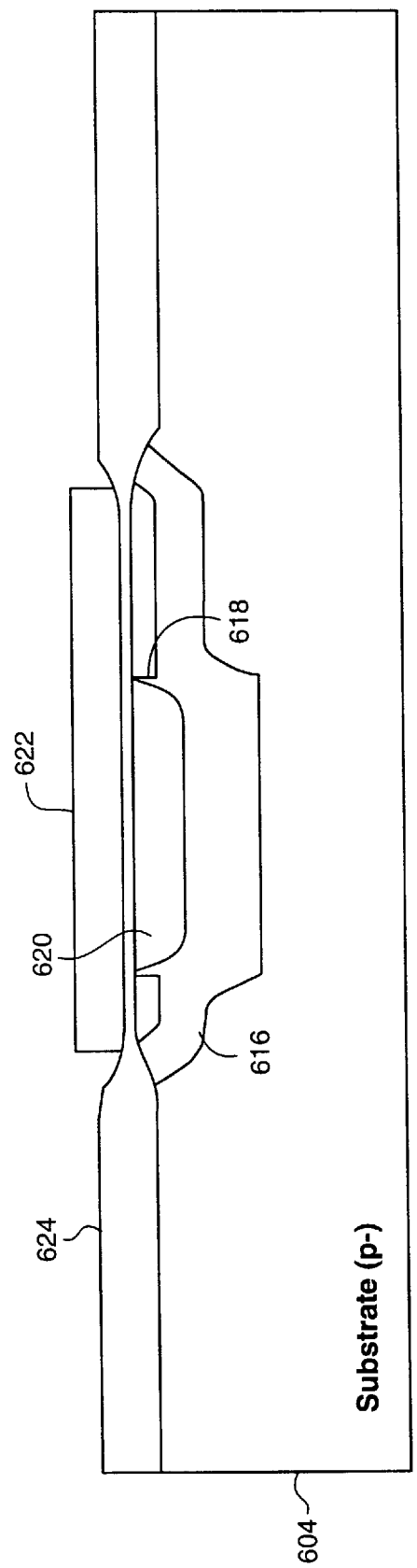
Figure 12:
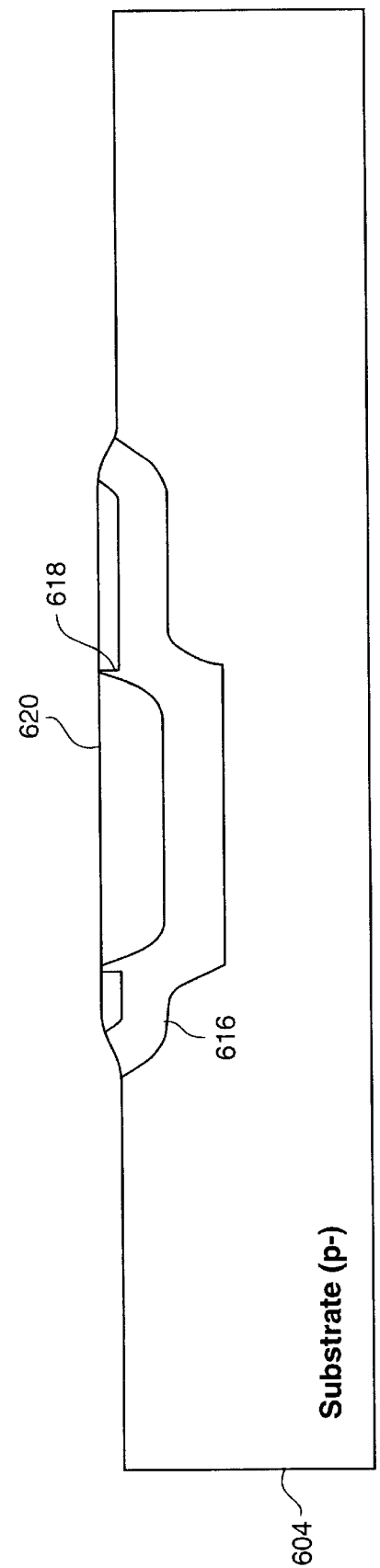

Photoresist 612 and silicon nitride 606 are then removed. As depicted in FIG. 10, a second layer of silicon nitride 622 is deposited and patterned using collector mask 609 in a clear field mode. Thus silicon nitride layer 622 is deposited over the portion of substrate 604 which was previously exposed by opening 610 in silicon nitride layer 606, now removed. Field oxide 624 is then grown as depicted in FIG. 11, over regions of substrate 604 where nitride layer 622 is absent. A simultaneous drive of the n-well 618 and p-region 620 forming the collector and base, respectively. Nitride 622 and oxide 624 are then stripped as illustrated in FIG. 12. The process steps depicted in FIGS. 10–12 serve to remove the n+ layer doping profile from the surface of the wafer. The resulting structure includes vertically modulated buried layer 616 in substrate 604, a portion of which underlies base region 620. Collector well 618 overlaps at least the portion of buried layer 616 underlying base 620. From this point, the substrate may be processed on a typical CMOS process route to form a BiCMOS integrated circuit.

With reference now to FIGS. 13–19, an alternative process flow for forming a vertically modulated subcollector in accordance with a preferred embodiment of the present invention is depicted, along with the mask levels used in the process. In this process, mask sequence 550 from FIG. 5 is used with the collector mask initially used in a clear field mode.

Figure 13:
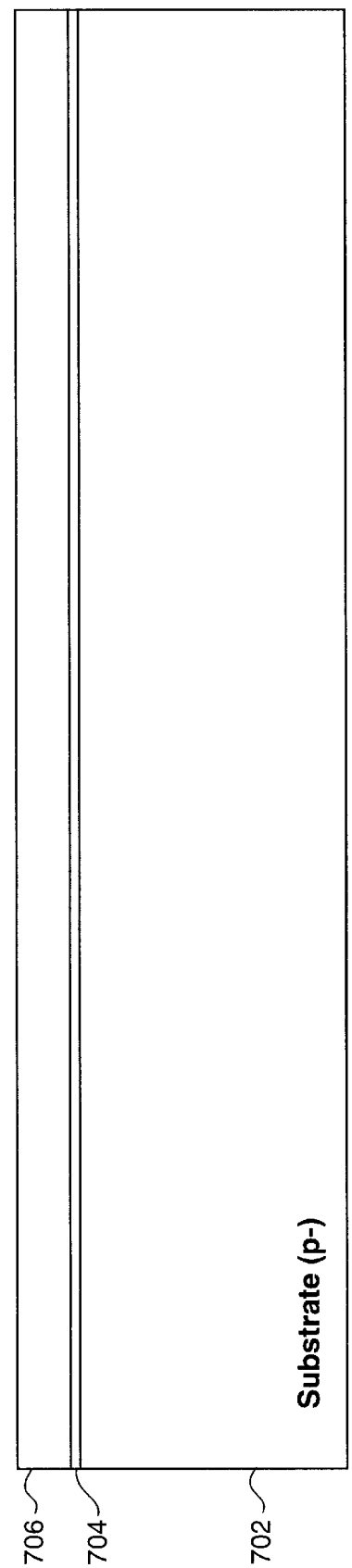
Figure 15:
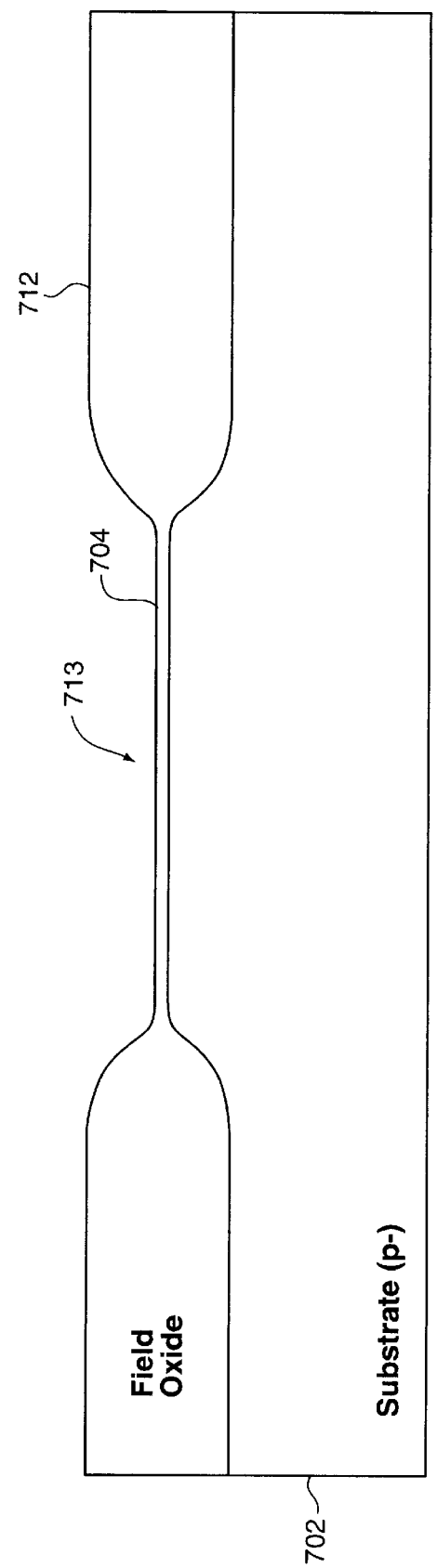

As with the previous process, the process begins with a substrate 702 on which a support/screen oxide 704 is grown and a silicon nitride layer 706 deposited as illustrated in FIG. 13. Substrate 702 is a lightly doped p-substrate in this depicted example. As depicted in FIG. 14, a layer of photoresist 708 is deposited and patterned using the collector mask 710, followed by an etch leaving an island of silicon nitride 707. Photoresist 708 is then removed and a well oxide/field oxide 712 grown over substrate 702 in regions which are not protected by nitride island 707, followed by removal of the nitride island 707 as illustrated in FIG. 15. An opening 713 through well oxide 712 remains in the region protected by nitride layer 707.

Figure 16A:
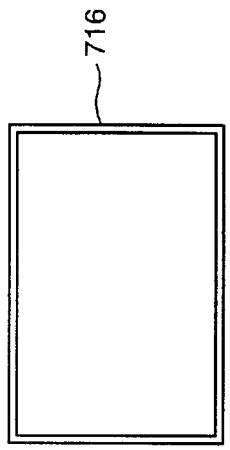
Figure 16B:
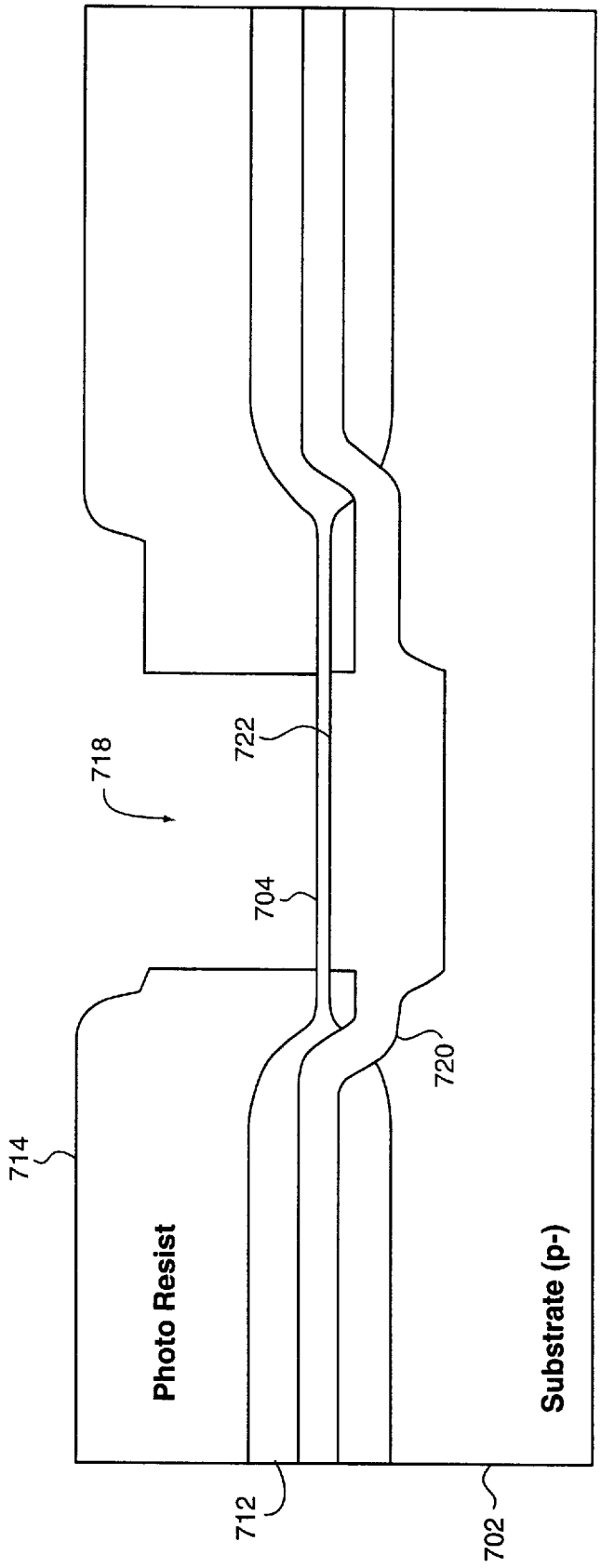

Referring to FIG. 16, a new layer of photoresist 714 is deposited and patterned using base mask 716 to define a window 718 for the base region. Window 718 in photoresist 714 is smaller than opening 713 in well oxide 712. A high energy implant of a suitable donor species forms buried n+ layer 720, vertically modulated by photoresist 714 and well oxide 712. The thicknesses of photoresist 714 and well oxide 712, together with the implant conditions, may be adjusted to control the doping profile of buried n+ layer 720. It may be desirable to tailor these variables so that, outside the region defined by collector mask 710 and nitride island 707, the doping profile of n+ layer 720 lies within well oxide 712 as shown and may be subsequently removed.

Figure 17A:
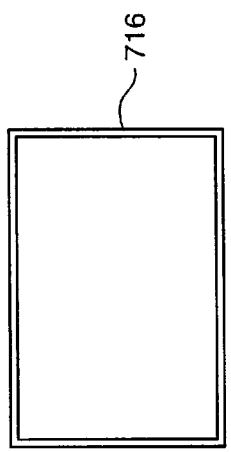
Figure 17B:
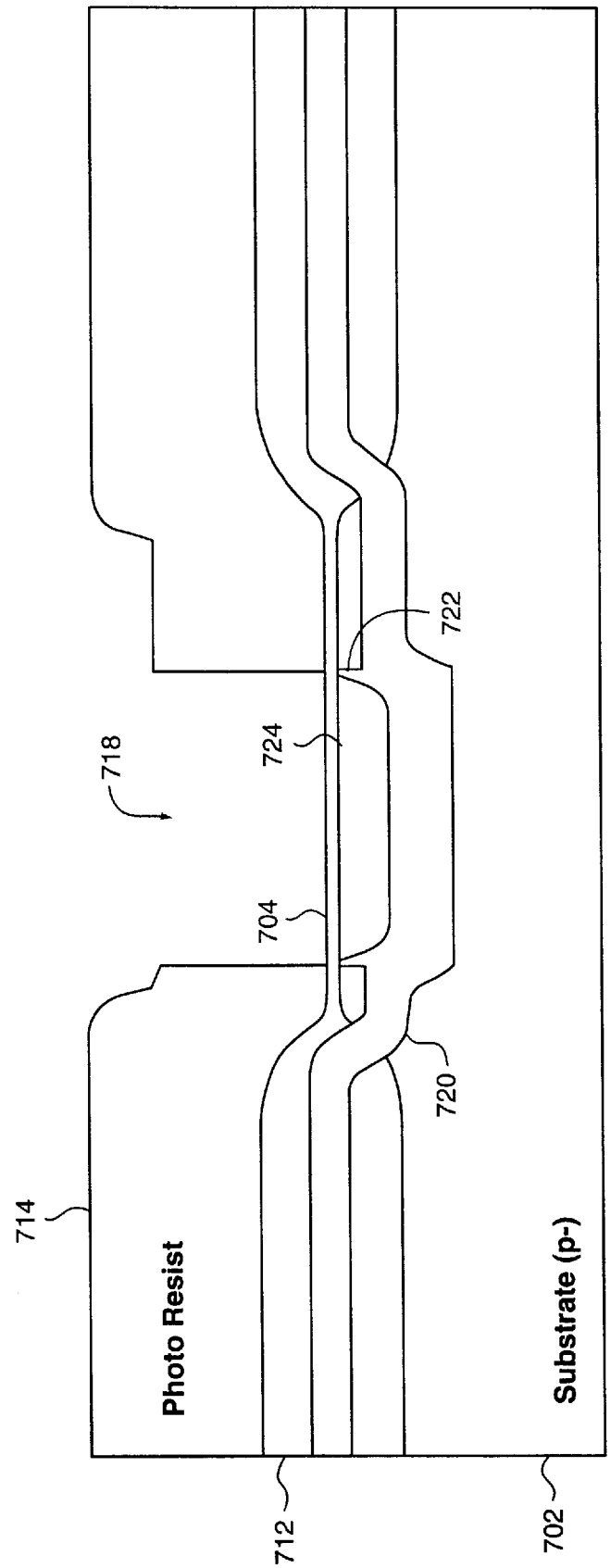

Following the high-energy implant, subsequent implants masked by photoresist 714 except in the region of window 718 may be performed to form n-well 722 for the collector and p-region 724 for the base, as depicted in FIG. 17. Depending on the final device characteristics desired, implant of p-region 724 may be deferred until a later point in the process flow, when photo masking operations using base mask 716 may be repeated.

Figure 18:
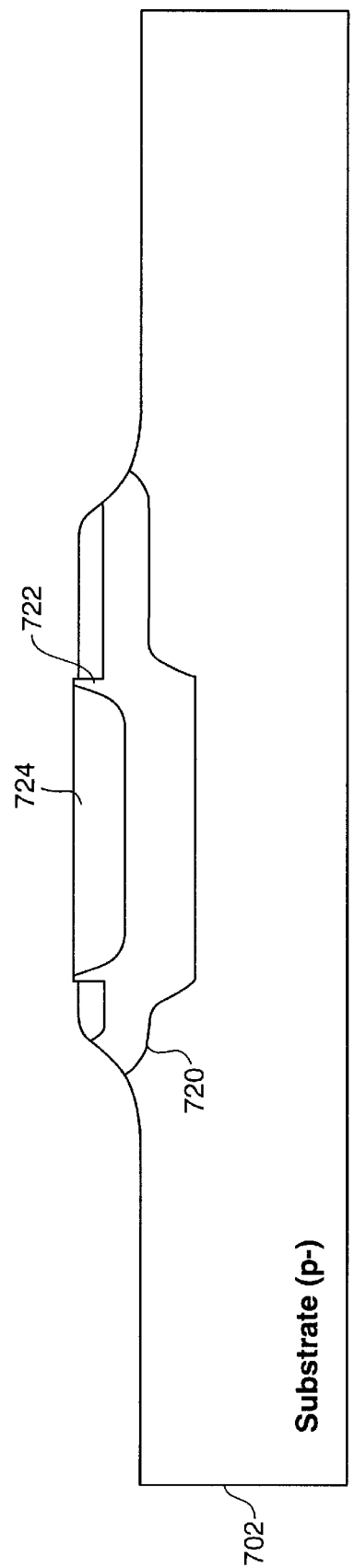
Figure 19:
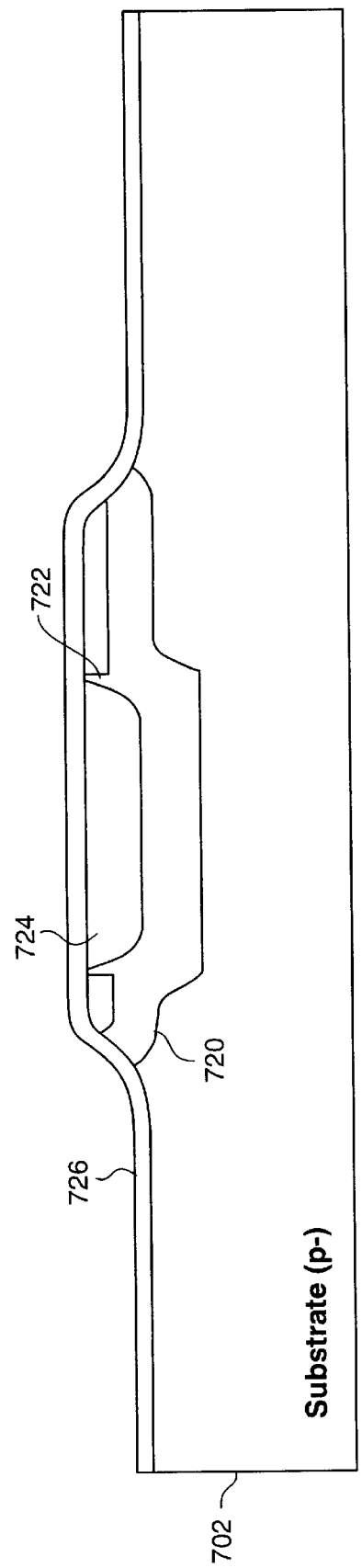

Photoresist 714, support oxide 704, and well oxide 712 are then removed as illustrated in FIG. 18. Well oxide 712 is preferably removed in a solution of hydrofluoric acid. The n+ doping profile within well oxide 712 is simultaneously removed. As with the previous process flow, this results in a structure in which collector well 722 only overlaps the portion of buried layer 720 underlying 724. At this point, the substrate may be processed in a typical CMOS process route to produce a BICMOS product. FIG. 19 illustrates this progression, where the substrate has been processed through a "zero level" oxidation typically used at the start of a CMOS process to form support/screen oxide 726.

Referring to FIGS. 20–27, a third process flow for forming a vertically modulated subcollector for a bipolar device in accordance with a preferred embodiment of the present invention is depicted, along with the mask levels used in the process. In this process, mask sequence 552 from FIG. 5 is used, this time with the collector mask initially used in a dark field mode. The process flow of FIGS. 20–27 represents a tighter integration of CMOS and NPN bipolar processing than the two previous process flows described.

Figure 20:
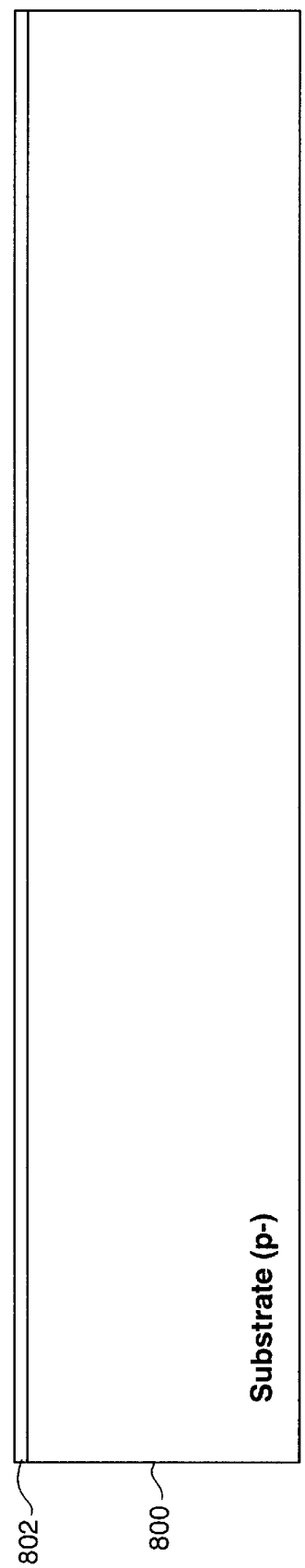
Figure 21A:
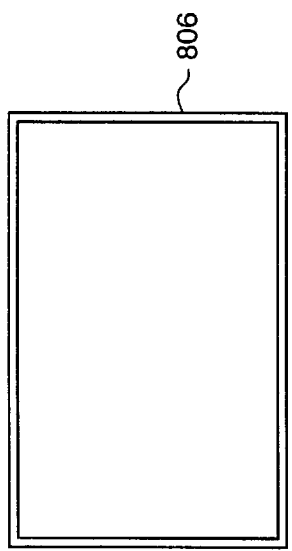
Figure 21B:
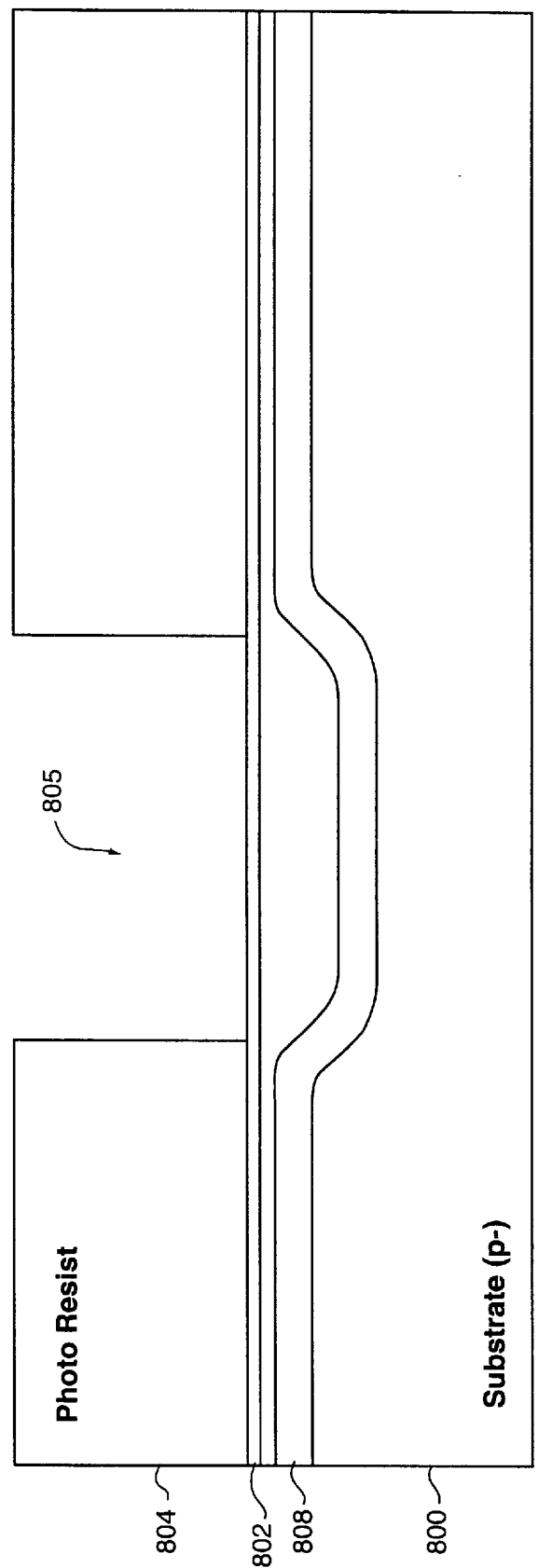

As depicted in FIG. 20, the process begins with a substrate 800, on which a support/screen oxide 802 is grown. Substrate 800 is again a lightly doped p-substrate in this depicted embodiment. A layer of photoresist 804 is deposited and patterned using collector mask 806, as depicted in FIG. 21. A high-energy implant of a suitable donor species is then performed, vertically modulated by photoresist 804 and opening 805 through photoresist 804, to form buried n+ layer 808. As described earlier, a single layer implantation mask is sufficient to form the bilevel buried layer 808 required to form a vertically modulated subcollector in accordance with the present invention. The thickness of photoresist 804 and the implant conditions may be adjusted to control the vertical doping profile of n+ layer 808.

After the high-energy implant, a photolithography step to define the collector region is performed. If a suitable photoresist has been used, the step may be performed by reexposing photoresist 804. Otherwise, photoresist 804 is stripped and a new layer of photoresist 810 is deposited. Photoresist 810 is patterned using a n-well mask 812 to form window 814. Opening 814 through photoresist 810 is larger than opening 805 in photoresist 804.

Performance of the photolithography step forming opening 814 in photoresist 810 may be coincident with the n-well photolithography step of a CMOS process. It is assumed that n-well mask 812 is drawn to a shape derived from the collector mask data. An n-well implant through window 814 in photoresist 810 forms the collector. In this embodiment, collector well 816 overlaps the entire portion of buried layer 808 which will form the subcollector.

Figure 23A:
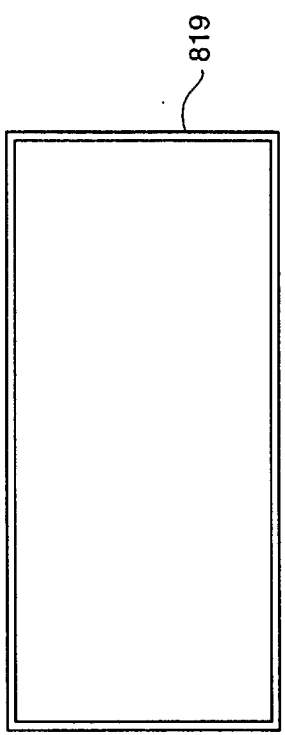
Figure 23B:
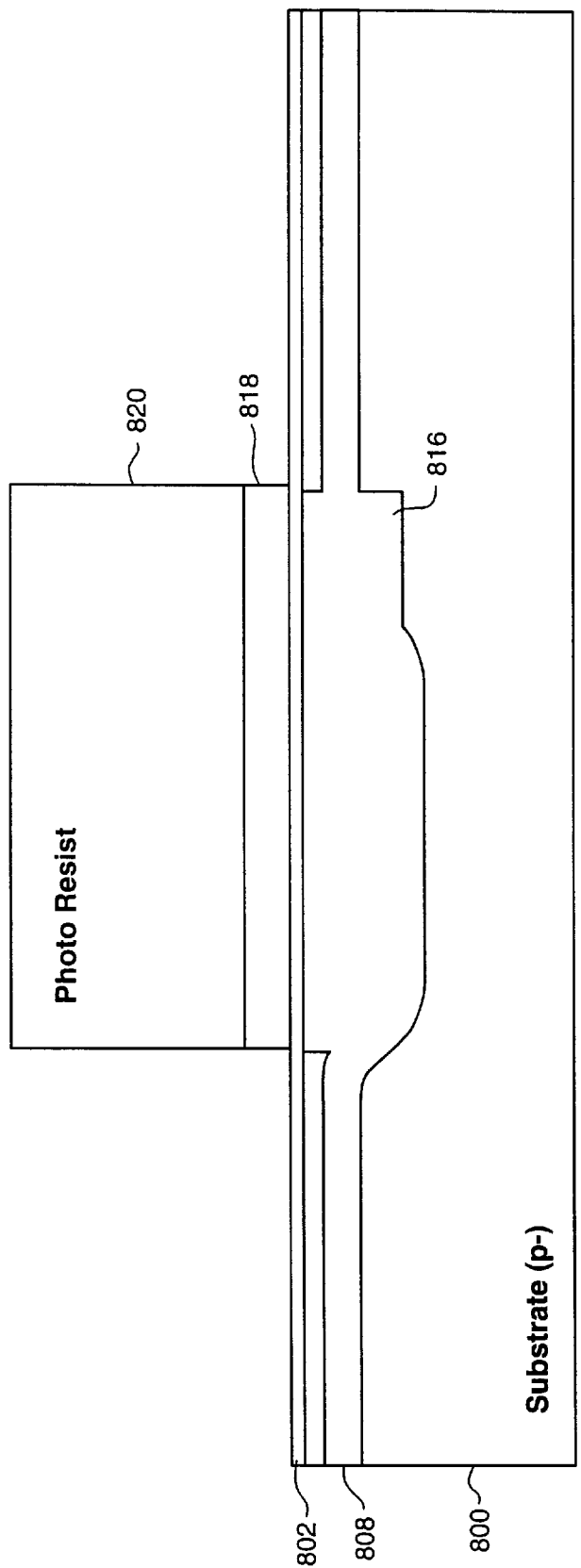

Referring to FIG. 23, after the n-well implant photoresist 810 is stripped and a layer of nitride 818 is deposited, on which is deposited another layer of photoresist 820. Photoresist 820 is patterned using p-well mask 819 (which is the opposite of n-well mask 812), and nitride 818 is etched to leave a protective island of nitride over the collector and subcollector. A well oxidation is then performed to grow field oxide 822 as illustrated in FIG. 24A. A silicon nitride strip/etch and an oxide strip/etch, preferably in acid solutions, follows to remove nitride 818 and oxide 822. Growth of field oxide 822 and subsequent removal serves to consume and eliminate any n+ doping concentration that may exist at the surface of the wafer, removing the potential conflict with field implant profiles as described earlier. These steps may not be necessary, depending on the availability of other methods to avoid conflict with required field implants.

Figure 25A:
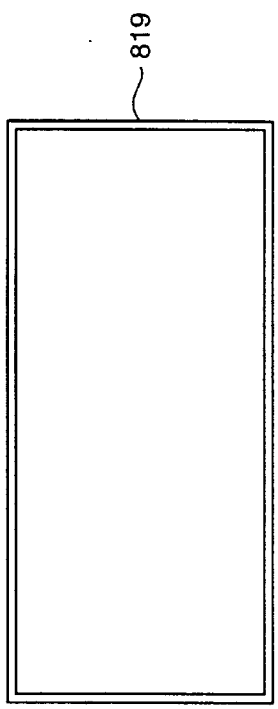
Figure 25B:
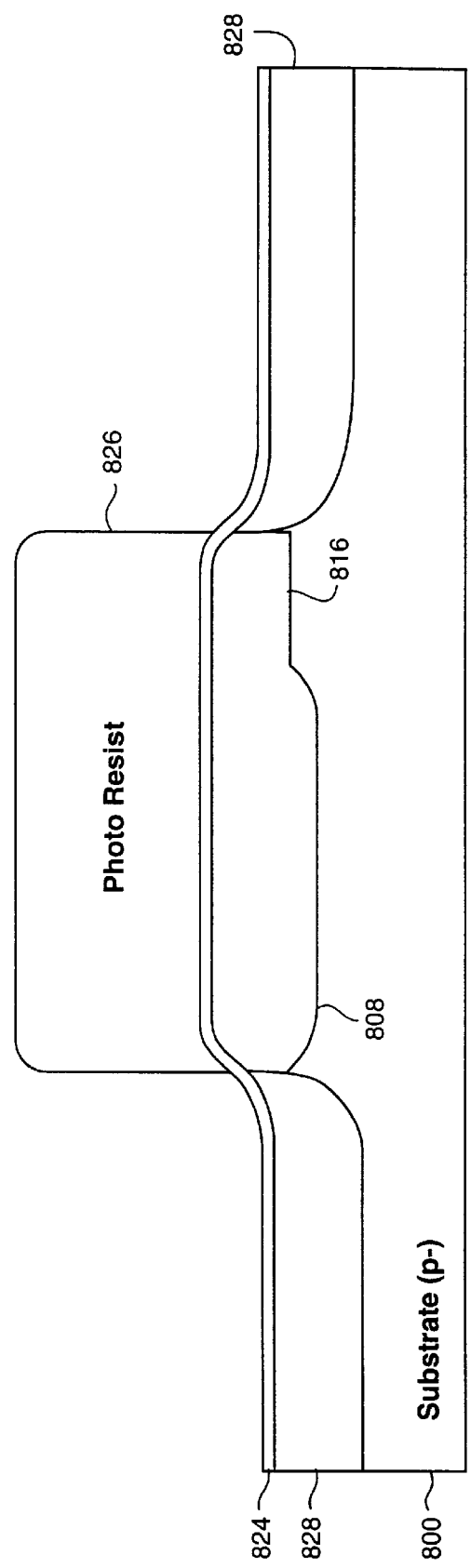

Following the oxide strip, screen oxide 824 is grown as depicted in FIG. 24B. A layer of photoresist 826 is again deposited and patterned using p-well mask 819, followed by implantation of the p-wells 828 as illustrated in FIG. 25. At this point, the structure is fairly consistent with the product of CMOS front-end processing. The flow can now continue with typical CMOS process steps that occur after well formation (i.e., field implant, active formation, field growth, etc.).

Figure 26A:
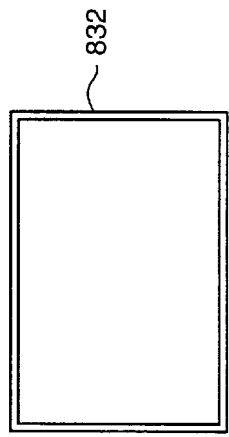
Figure 26B:
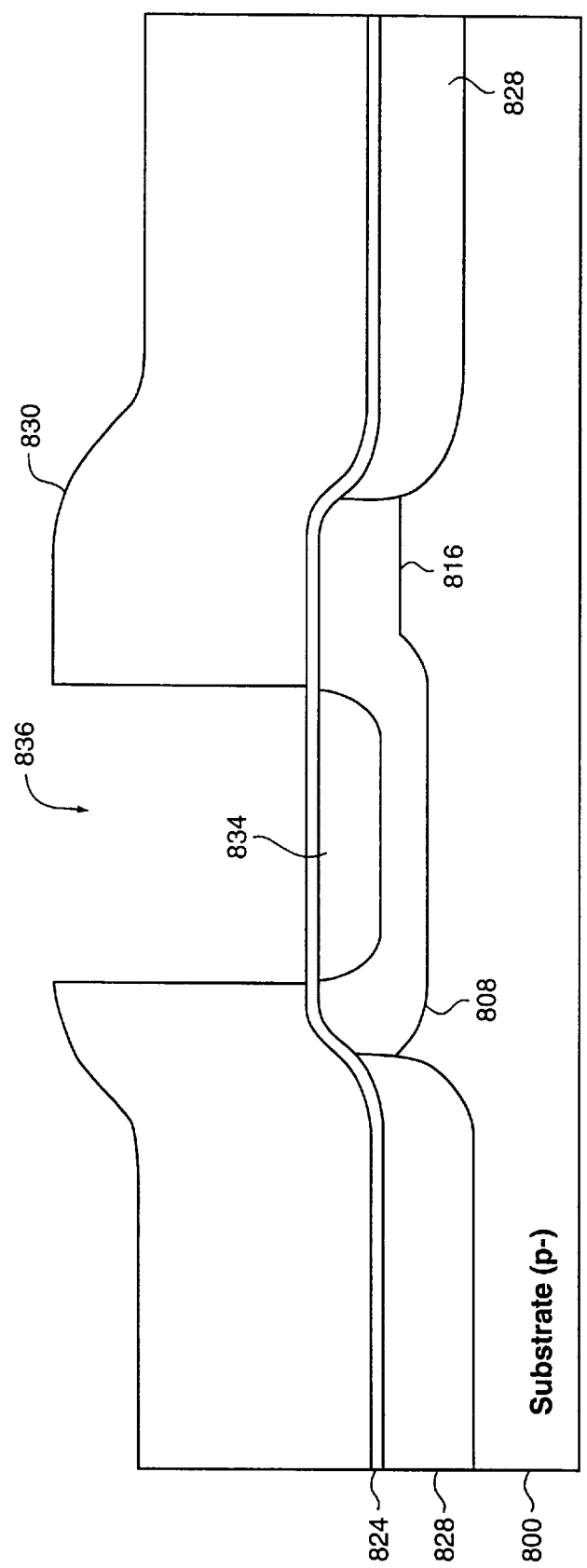
Figure 27:
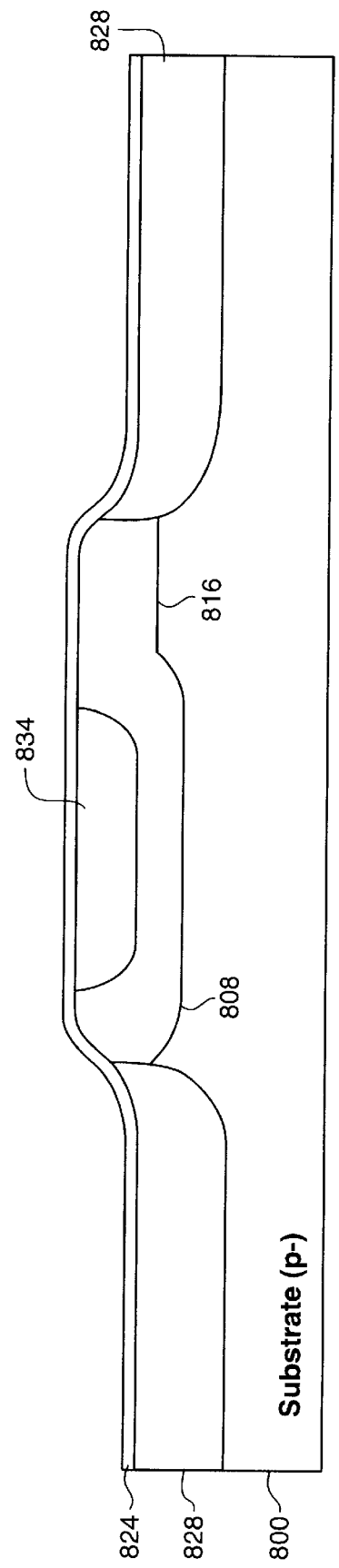
Figure 28:
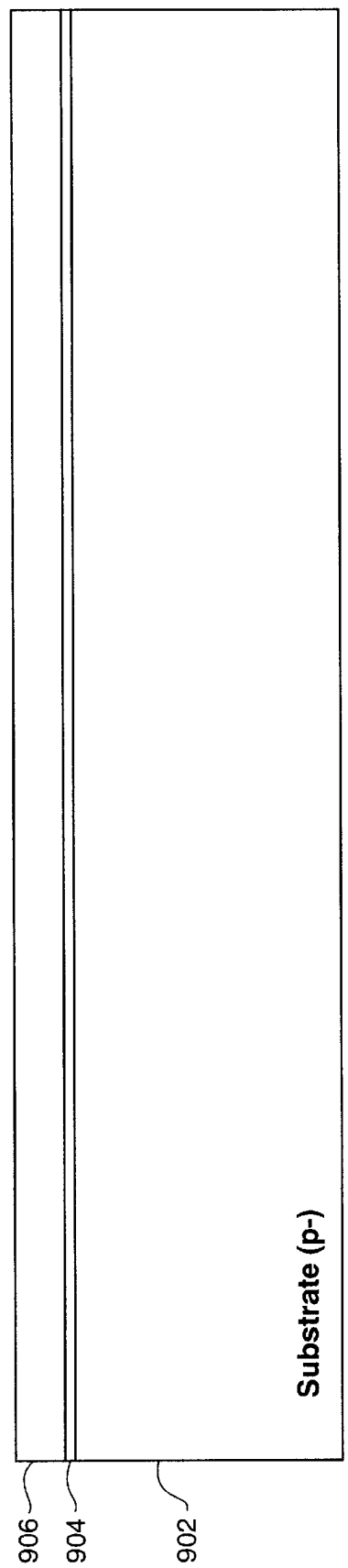

As depicted in FIG. 26, a photoresist layer 830 is deposited and patterned using base mask 832 to allow an implant through window 836 in photoresist 830 of p-region 834 forming the base. Opening 836 in photoresist 830 is smaller than opening 805 in photoresist layer 804. As noted earlier, placement of the base formation step within the process flow is a function of the desired device characteristics. Photoresist 830 is stripped to leave the final structure illustrated in FIG. 27.

Figure 29A:
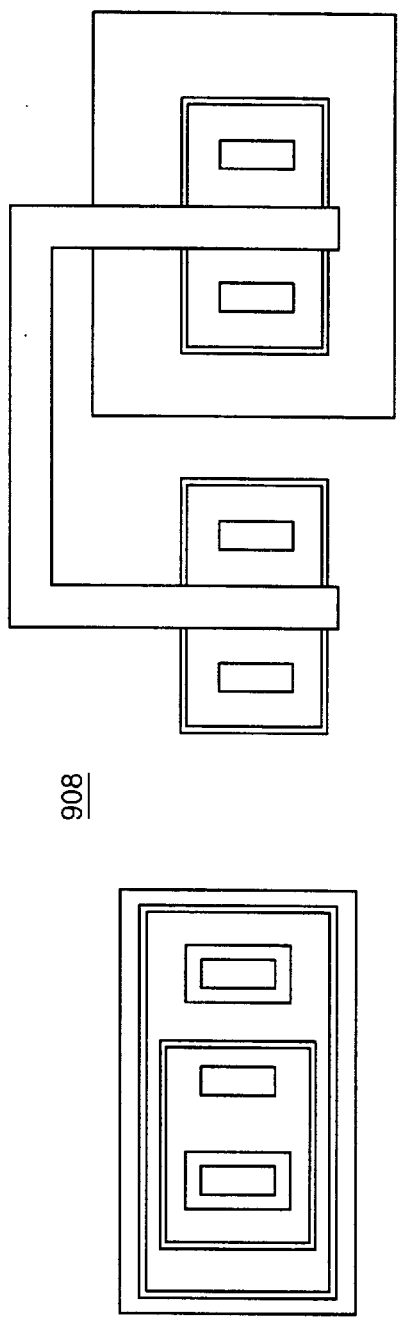
Figure 29B:
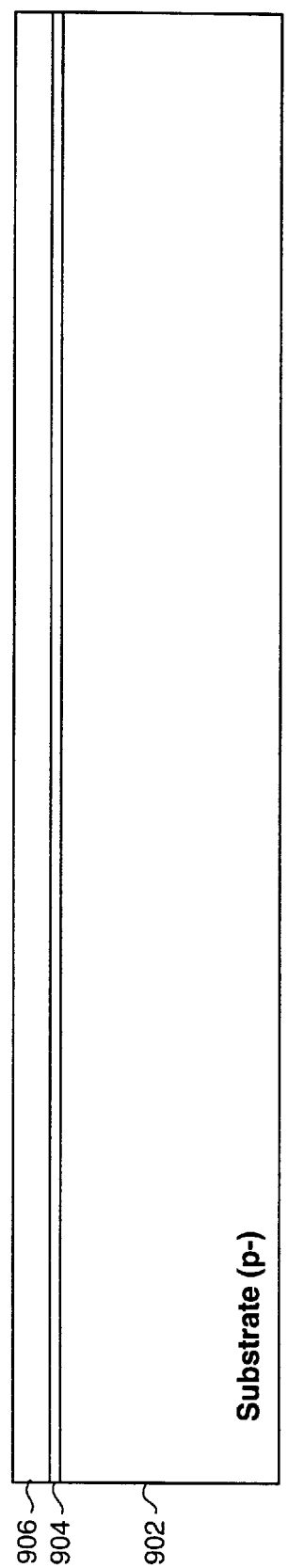
Figure 32A:
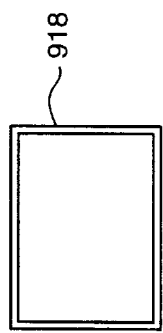
Figure 32B:
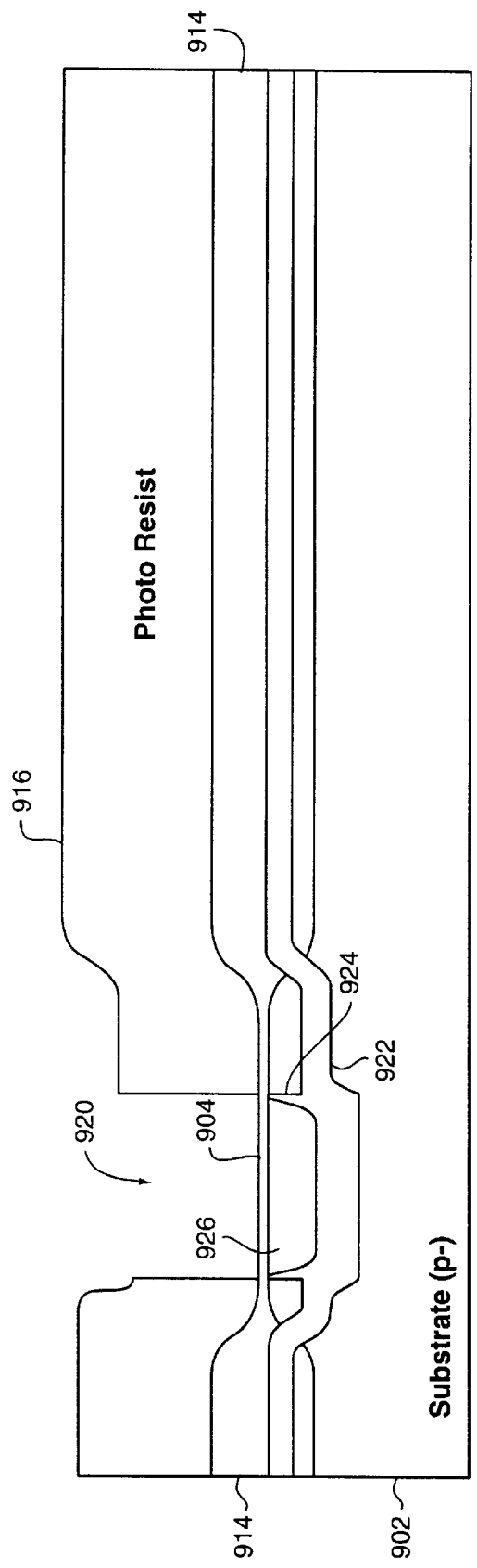

With reference now to FIGS. 28–43, a fully integrated BiCMOS flow incorporating a vertically modulated subcollector in accordance with a preferred embodiment of the present invention is illustrated. The process begins with a substrate 902 on which support oxide 904 is grown and nitride layer 906 is deposited. Substrate 902 is a lightly doped p-substrate in the embodiment shown. The mask layout 908 used for the process is depicted FIG. 29. Photoresist 910 is deposited and patterned, as illustrated in FIG. 30, using collector mask 912 in a clear field mode to define the region of the modulated n+ buried layer. Photoresist 910 is removed and a well oxidation performed to grow oxide 914, after which nitride 906 is removed as depicted in FIG. 31. As illustrated in FIG. 32, a new photoresist layer 916 is deposited and patterned using base mask 918 to form window 920. A high energy implant, vertically modulated by photoresist 916 and oxide 914, forms buried n+ layer 922 which makes up the subcollector for the bipolar device. A subsequent implant through window 920 creates the n-well 926 forming the collector. An additional implant through window 920 may be performed to form base/p-region 926 as shown, or formation of the base may be optionally deferred until a later point in the process.

Figure 33:
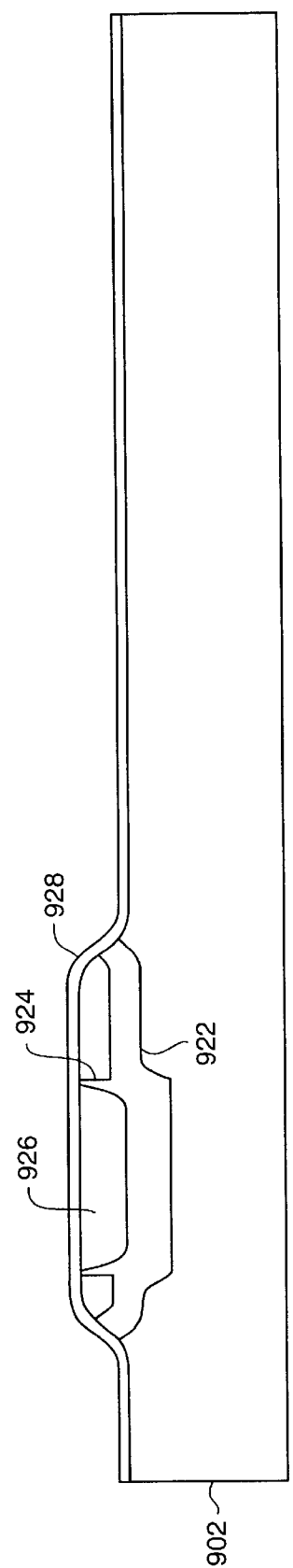
Figure 34A:
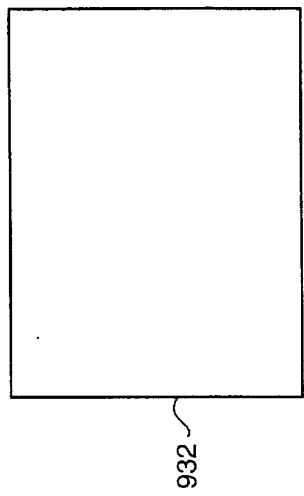
Figure 34B:
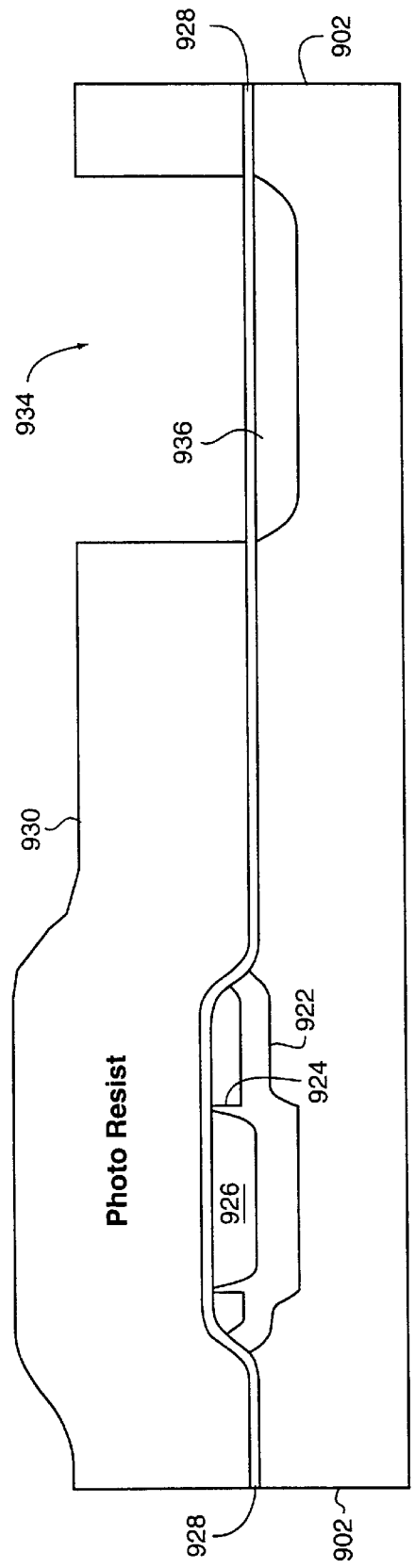

As depicted in FIG. 33, photoresist 916 is stripped and oxide 914 removed, followed by growth of support/screen oxide 928. A layer of photoresist 930 is then deposited and patterned using n-well mask 932 to form window 934 through which n-well 936 for PMOS devices is implanted, as illustrated in FIG. 34. The n-well 936 formation may be followed by formation of a p-well using the "opposite" mask data of n-well mask 932. Alternatively, a blanket adjust implant may be performed.

Figure 35A:
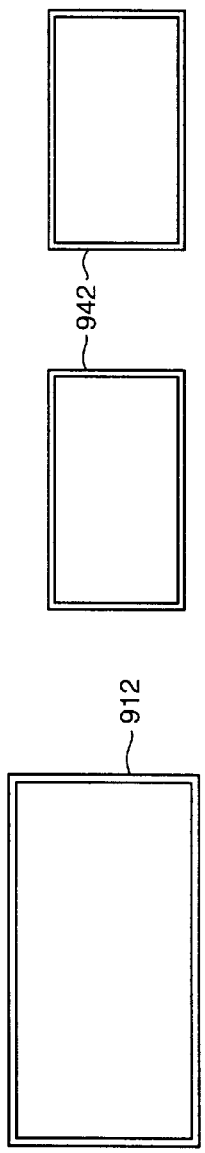
Figure 35B:
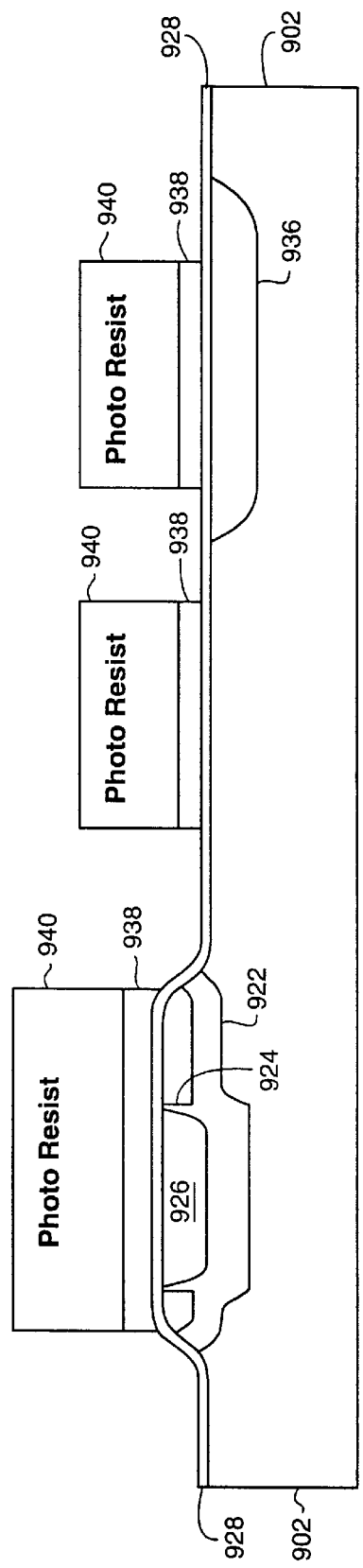
Figure 36A:
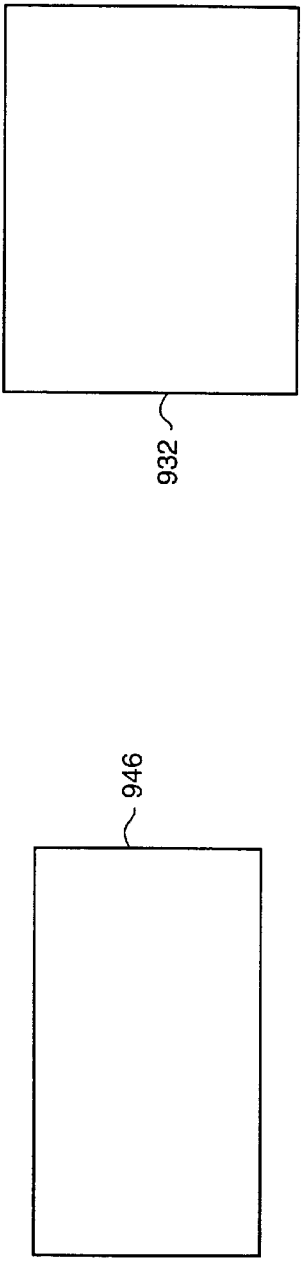
Figure 36B:
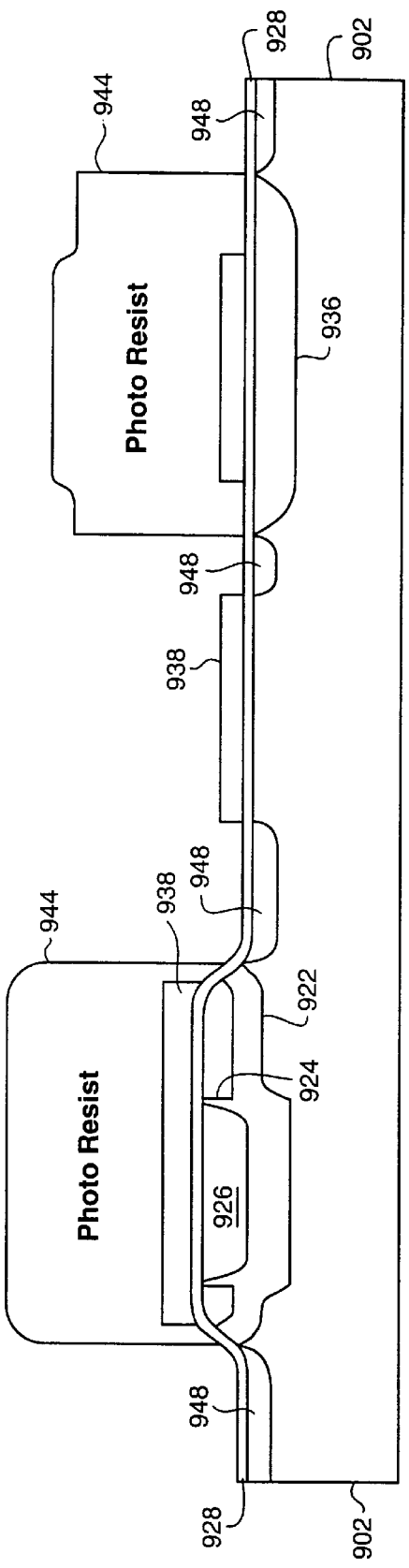
Figure 37A:
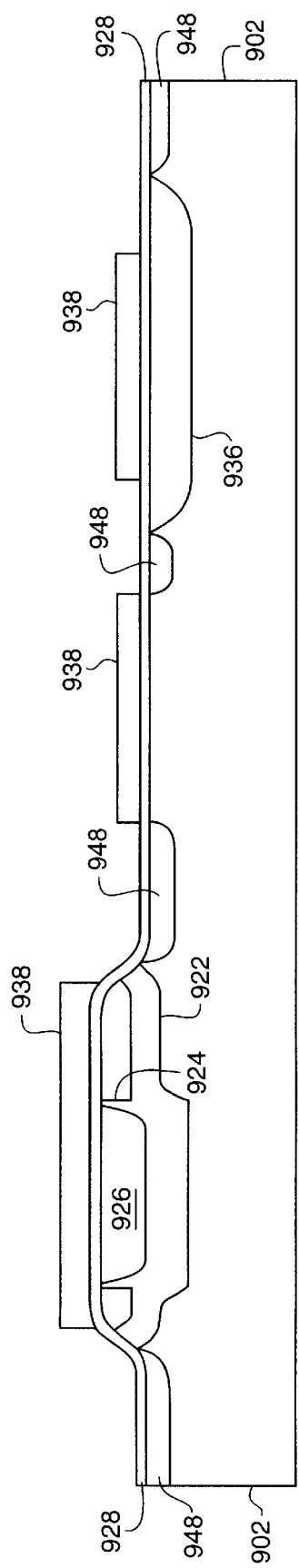
Figure 37B:
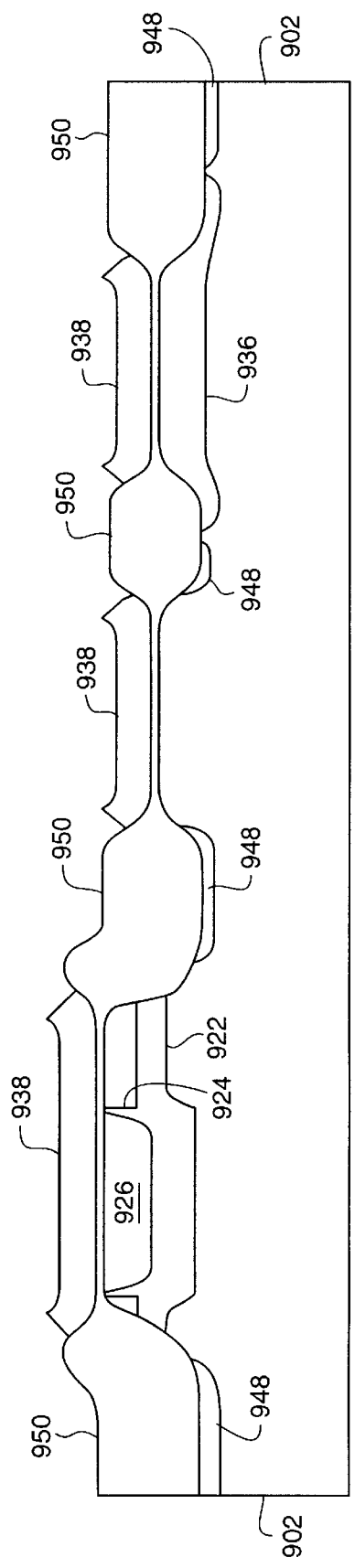

Referring to FIG. 35, nitride layer 938 is deposited, over which a photoresist 940 is deposited. Photoresist 940 is patterned using collector mask 912 and active MOS mask 942. Nitride layer 938 is then etched to leave protective islands of nitride over the active regions of the substrate. As depicted in FIG. 36, photoresist 940 is stripped and replaced with new photoresist 944. Photoresist 944 is patterned using collector region mask 946 and n-well mask 932. Patterned photoresist 944 masks implantation of field implants 948. Photoresist 944 is then stripped and field oxide 950 grown, as illustrated in FIGS. 37A–37B. Nitride 938 is then removed as depicted in FIG. 38A. Next, gate oxide 952 is grown and polysilicon layer 954 deposited as illustrated in FIG. 38B.

Figure 39A:
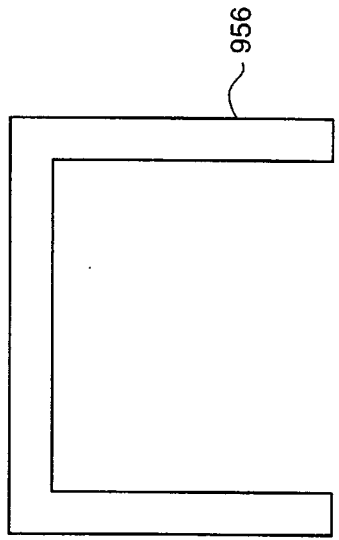
Figure 39B:
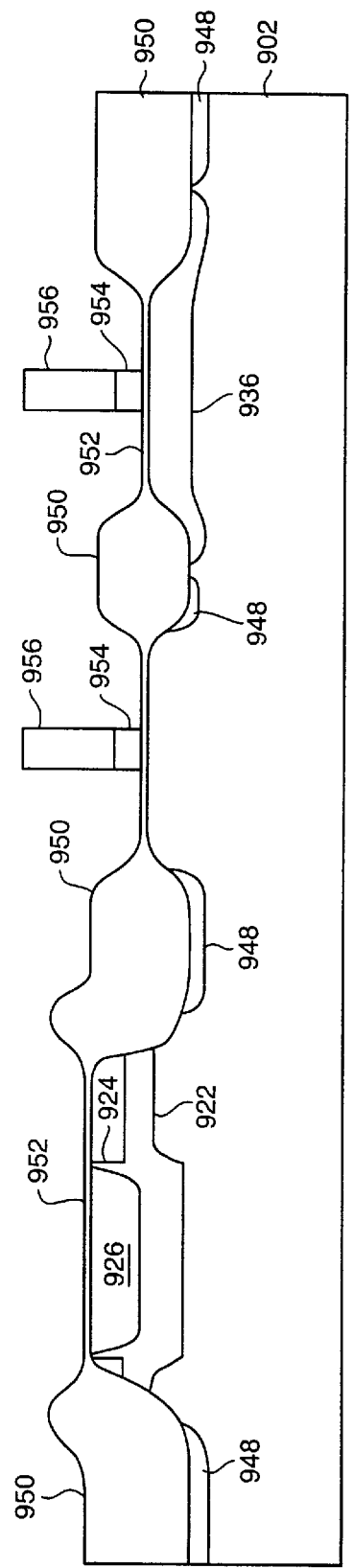
Figure 40A:
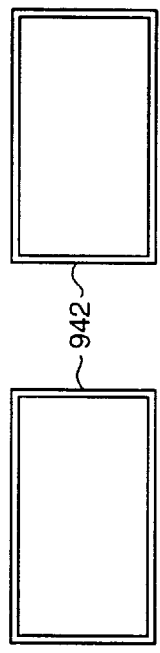
Figure 40B:
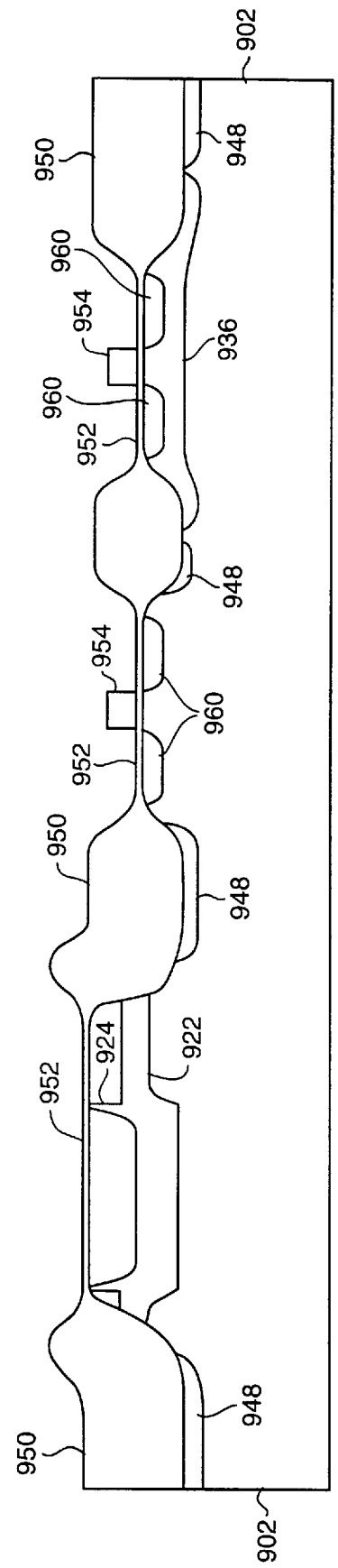
Figure 41A:
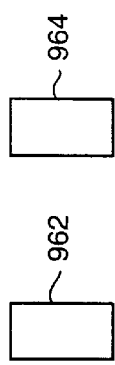
Figure 41B:
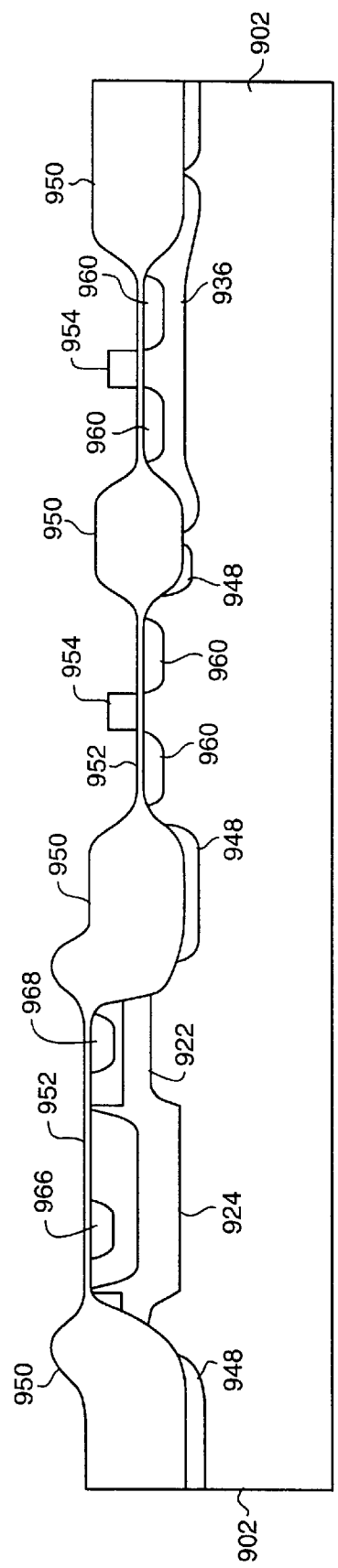

Referring to FIG. 39, a layer of photoresist 956 is deposited and patterned using poly-1 mask 958, and exposed portions of polysilicon layer 954 are removed. As depicted in FIG. 40, active MOS masks 942 are used individually to pattern photoresist (not shown) to mask separate implantation of source/drain regions 960 for the MOS devices. Next, as illustrated in FIG. 41, emitter region and collector region masks 962 and 964 are used to pattern photoresist (not shown) to mask implantation of the emitter region 966 and collector contact region 968. A small gap between collector contact region 968 and subcollector 922 may be acceptable, but preferably collector contact region 968 and subcollector 922 contact or overlap. Implantation of the emitter and collector contact regions 966 and 968 may alternatively be performed before implantation of source/drain regions 960 for the MOS devices.

Figure 42A:
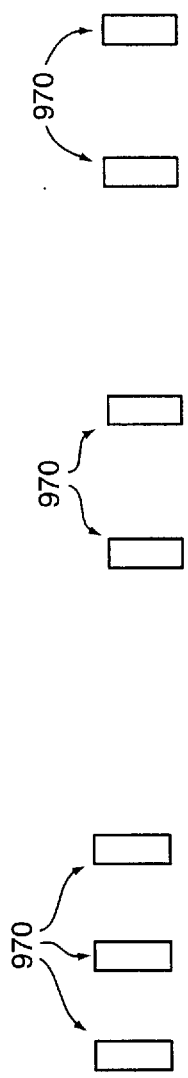
Figure 42B:
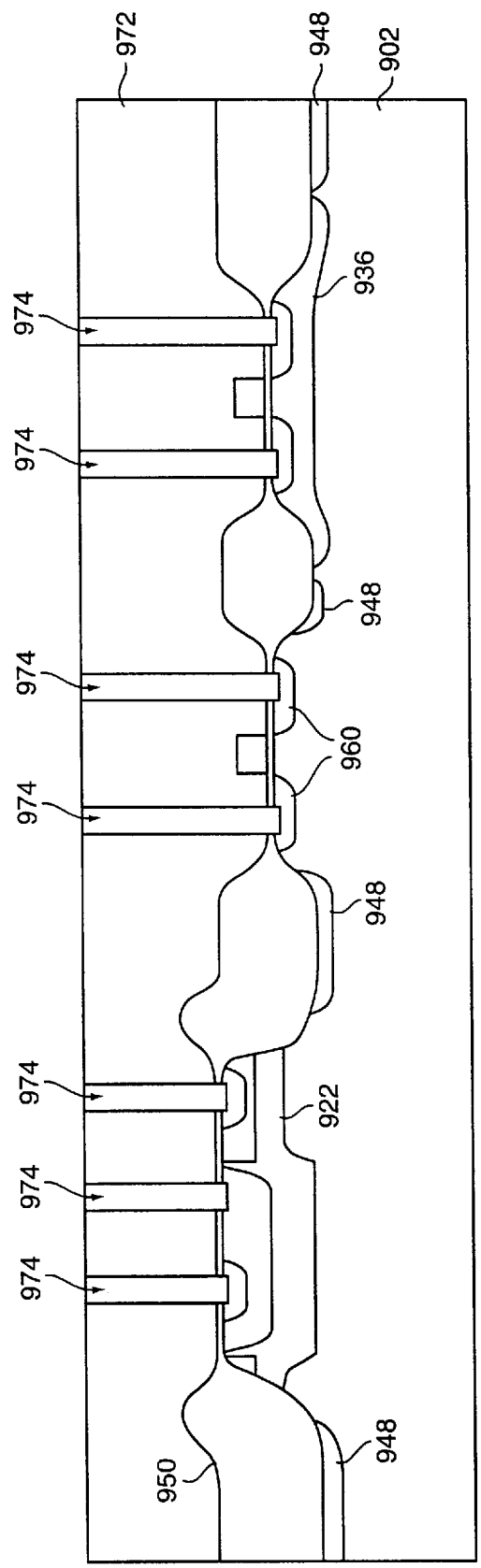
Figure 43:
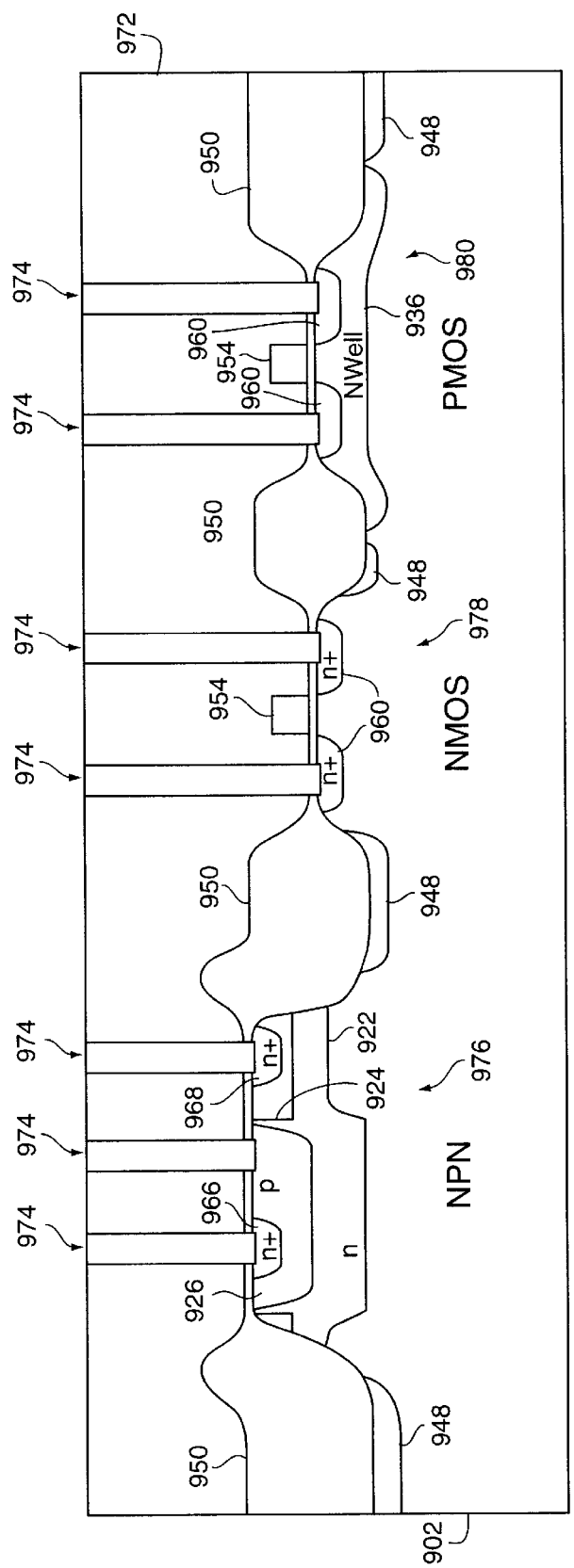

Referring to FIG. 42, a passivation/planarization layer 972 is deposited and, patterning a layer of photoresist (not shown) using contact mask 970, contact openings are etched. FIG. 43 illustrates the final BiCMOS structure through the contact level, including a vertically integrated NPN bipolar transistor with a vertically modulated subcollector in accordance with a preferred embodiment of the present invention and a NMOS and PMOS transistors. Bipolar device 976 includes bilevel subcollector 922 with a portion underlying base 926 and overlapping collector 924. That portion is vertically displaced from the remainder of subcollector 922. NMOS field effect transistor 978 is deposited in substrate 902 and PMOS field effect transistor 980 is deposited within well 936 within substrate 902. Field oxide regions 950 on substrate 902 between NPN bipolar device 976, NMOS transistor 978, and PMOS transistor 980 provide isolation, along with field implant regions 948 beneath field oxide regions 950.

Use of a vertically modulated sub-collector in accordance with the present invention avoids the necessity of sinker implants or other additional process steps to reduce parasitic collector resistance. Vertical and lateral components of the collector resistance are simultaneously reduced by a single, vertically modulated sub-collector. Necessary processing modifications can be readily integrated into typical BiCMOS process flows.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. A method of forming a vertically modulated subcollector for a bipolar device, comprising:

forming an implantation mask over at least a portion of a semiconductor substrate, the implantation mask arranged to provide a vertically modulated buried layer;

implanting impurities through the implantation mask into the substrate to form a vertically modulated buried layer; and forming a well within the substrate which at least partially overlaps the buried layer, wherein a vertically modulated subcollector for the collector of a bipolar device is formed.

2. The method of claim 1 wherein the step of forming an implantation mask further comprises:

forming a nitride layer over the substrate, the nitride layer having an opening exposing a portion of the substrate;

forming a photoresist layer over the nitride layer and the exposed portion of the substrate; and patterning the photoresist layer to provide an opening through the photoresist layer, wherein the opening through the photoresist layer is larger than the opening through the nitride layer.

3. The method of claim 1 wherein the step of forming an implantation mask further comprises:

forming a nitride layer over the substrate, the nitride layer having an opening exposing a portion of the substrate;

forming a photoresist layer over the nitride layer and the exposed portion of the substrate; and patterning the photoresist layer to provide an opening through the photoresist layer, wherein the opening through the photoresist layer is smaller than the opening through the nitride layer.

4. The method of claim 3 wherein the step of forming a well further comprises:

implanting impurities through the opening in the photoresist layer.

5. The method of claim 4 wherein the step of implanting impurities through the opening in the photoresist layer further comprises implanting impurities of a first conductivity type, the method further comprising:

implanting impurities of a second conductivity type through the opening in the photoresist layer to form a doped region within the well.

6. The method of claim 5 wherein the nitride layer comprises a first nitride layer, the method further comprising:

removing the photoresist layer and the first nitride layer;

forming a second nitride layer over a portion of the substrate which was previously exposed by the opening through the first nitride layer;

forming an oxide layer overlying the substrate in a region where the second nitride layer is absent; and removing the second nitride layer and the oxide layer.

7. The method of claim 1 wherein the step of forming an implantation mask further comprises:

forming an oxide layer over the substrate, the oxide layer having an opening therethrough;

forming a photoresist layer over the oxide layer and the opening through the oxide layer; and patterning the photoresist layer to provide an opening through the photoresist layer, wherein the opening through the photoresist layer is smaller than the opening through the oxide layer.

8. The method of claim 7 wherein the step of forming an oxide layer over the substrate further comprises:

forming a nitride layer over a portion of the substrate; and forming an oxide layer over a portion of the substrate where the nitride layer is absent.

9. The method of claim 7 wherein the step of forming a well further comprises:

implanting impurities through the opening in the photoresist layer.

10. The method of claim 9 wherein the step of implanting impurities through the opening in the photoresist layer further comprises implanting impurities of a first conductivity type, the method further comprising:

implanting impurities of a second conductivity type through the opening in the photoresist layer to form a doped region within the well; and removing the photoresist layer and oxide layer.

11. The method of claim 1 wherein the step of forming an implantation mask further comprises:

forming a photoresist layer over the substrate; and patterning the photoresist layer to provide an opening therethrough.

12. The method of claim 11 wherein the photoresist layer comprises a first photoresist layer and the step of forming a well further comprises:

removing the first photoresist layer;

forming a second photoresist layer over the substrate;

patterning the second photoresist layer to provide an opening therethrough, wherein the opening through the second photoresist layer is larger than the opening through the first photoresist layer; and implanting impurities through the opening in the second photoresist layer.

13. The method of claim 12, further comprising:

removing the second photoresist layer;

forming a nitride layer over a portion of the substrate which was previously exposed by the opening through the second photoresist layer;

forming an oxide layer overlying the substrate in a region where the nitride layer is absent; and removing the nitride layer and the oxide layer.

14. The method of claim 13 wherein the step of implanting impurities through the opening in the second photoresist layer further comprises implanting impurities of a first conductivity type, the method further comprising:

forming a third photoresist layer over the substrate;

patterning the third photoresist layer to provide an opening therethrough, wherein the opening through the third photoresist layer is smaller than the opening through the first photoresist layer; and implanting impurities of a second conductivity type through the opening in the third photoresist layer to form a doped region within the well.

15. A method of forming a portion of an integrated circuit, comprising:

forming an implantation mask over at least a portion of a substrate, the implantation mask arranged to provide a vertically modulated buried layer;

forming a subcollector by implanting impurities through the implantation mask into the substrate to form a vertically modulated buried layer; and forming a collector by forming a well within the substrate which at least partially overlaps the subcollector; and forming a base by forming a doped region within the well above the subcollector.

16. The method of claim 15, further comprising:

forming an emitter within the base; and forming a collector contact region in the well outside the base, wherein a bipolar device having a vertically modulated subcollector is formed.

17. The method of claim 16, further comprising:

forming a field effect transistor in the substrate; and forming a field oxide on the substrate between the field effect transistor and the well, wherein a BiCMOS integrated circuit structure including a bipolar device having a vertically modulated subcollector is formed.

* * * * *